United States Patent
Liu et al.

(10) Patent No.: US 9,559,209 B2
(45) Date of Patent: Jan. 31, 2017

(54) FIELD EFFECT TRANSISTORS AND METHODS OF FORMING SAME

(71) Applicants: National Taiwan University, Taipei (TW); Taiwan Semiconductor Manufacturing Company, Ltd., Hsin-Chu (TW)

(72) Inventors: Chee Wee Liu, Taipei (TW); Samuel C. Pan, Hsin-Chu (TW); I-Hsieh Wong, Kaohsiung (TW); Hung-Yu Yeh, Taichung (TW)

(73) Assignees: Taiwan Semiconductor Manufacturing Company Ltd., Hsin-Chu (TW); National Taiwan University, Taipei (TW)

(*) Notice: Subject to any disclaimer, the term of this patent is extended or adjusted under 35 U.S.C. 154(b) by 0 days.

(21) Appl. No.: 14/739,931

(22) Filed: Jun. 15, 2015

(65) Prior Publication Data
US 2016/0365457 A1 Dec. 15, 2016

(51) Int. Cl.
| H01L 29/66 | (2006.01) |
| H01L 29/786 | (2006.01) |
| H01L 29/78 | (2006.01) |
| H01L 29/423 | (2006.01) |
| H01L 29/06 | (2006.01) |

(52) U.S. Cl.
CPC ..... *H01L 29/78642* (2013.01); *H01L 29/0649* (2013.01); *H01L 29/42392* (2013.01); *H01L 29/66742* (2013.01); *H01L 29/7848* (2013.01); *H01L 29/78618* (2013.01); *H01L 29/78684* (2013.01); *H01L 29/78696* (2013.01)

(58) Field of Classification Search
CPC .................................................. H01L 29/78642
USPC .......................................................... 257/192
See application file for complete search history.

(56) References Cited

U.S. PATENT DOCUMENTS 5,689,127 A 11/1997 Chu et al.

OTHER PUBLICATIONS

Rooyackers, R., et al., "A New Complementary Hetero-Junction Vertical Tunnerl-FET Integration Scheme," 2013 IEEE International Electron Devices Meeting, Dec. 9-11, 2013, pp. 4.2.1-4.2.4.

*Primary Examiner* — Anthony Ho
(74) *Attorney, Agent, or Firm* — Slater Matsil, LLP

(57) ABSTRACT

Semiconductor devices and methods of forming the same are provided. A first source/drain layer is formed over a substrate. A channel layer is formed over the first source/drain layer. A second source/drain layer is formed over the channel layer. The first source/drain layer, the channel layer, and the second source/drain layer are patterned to form a fin-shaped structure. A gate stack is formed on a sidewall of the fin-shaped structure. The fin-shaped structure is patterned to expose a top surface of the first source/drain layer.

20 Claims, 24 Drawing Sheets

FIELD EFFECT TRANSISTORS AND METHODS OF FORMING SAME

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Transistors are circuit components or elements that are often formed on semiconductor devices. Many transistors may be formed on a semiconductor device in addition to capacitors, inductors, resistors, diodes, conductive lines, or other elements, depending on the circuit design. A field effect transistor (FET) is one type of transistor.

Generally, a transistor includes a gate stack formed between source and drain regions. The source and drain regions may include a doped region of a substrate and may exhibit a doping profile suitable for a particular application. The gate stack is positioned over the channel region and may include a gate dielectric interposed between a gate electrode and the channel region in the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
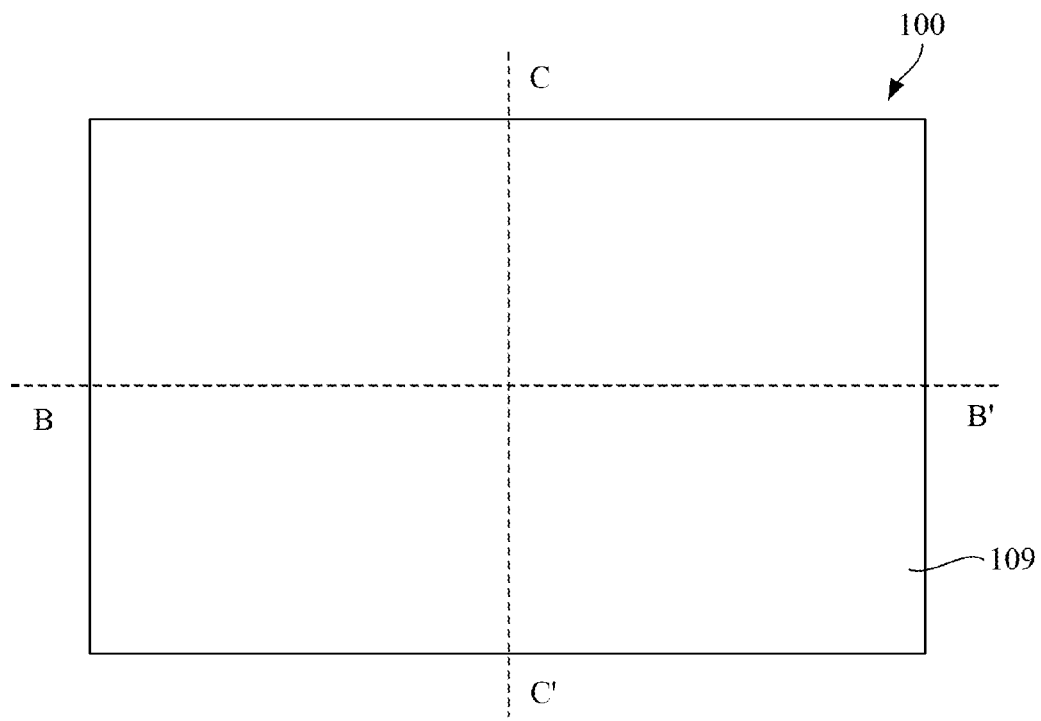
FIGS. 1A-8C illustrate various top and cross-sectional views of a fabrication process of a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Field effect transistors (FETs) and methods of forming the same are provided in accordance with various exemplary embodiments. The intermediate stages of forming the FETs are illustrated. Variations of the embodiments are discussed. Throughout the various views and illustrative embodiments, like reference numbers are used to designate like elements.

FIGS. 1A-8C illustrate various intermediate stages of fabrication of a semiconductor device 100 in accordance with some embodiments. FIGS. 1A-8C illustrate top and cross-sectional views, wherein an "A" figure represents a top view, a "B" figure represents a first cross-sectional view along the B-B' line of the respective "A" figure, and a "C" figure represents a second cross-sectional view along the C-C' line (perpendicular to the B-B' line) of the respective "A" figure. Moreover, various elements of FIGS. 1A-8C are depicted using dashed lines to indicate that such elements are invisible in top and cross-sectional views illustrated in FIGS. 1A-8C.

Figure 1B:
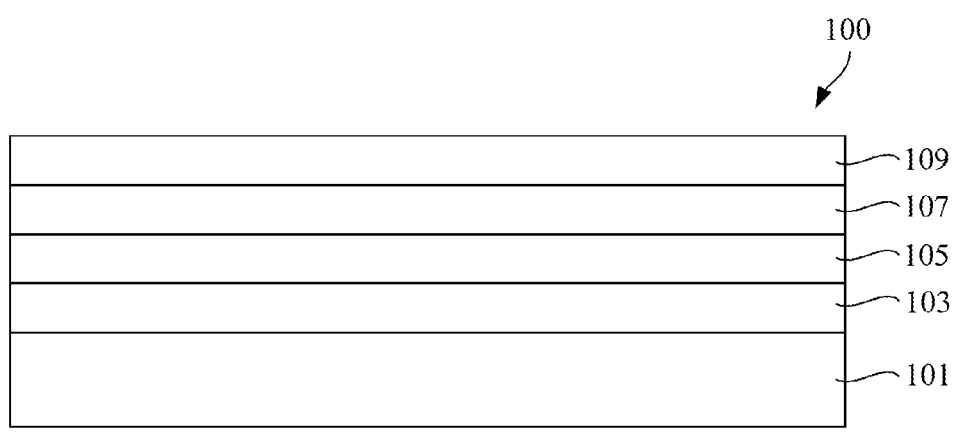
Figure 1C:
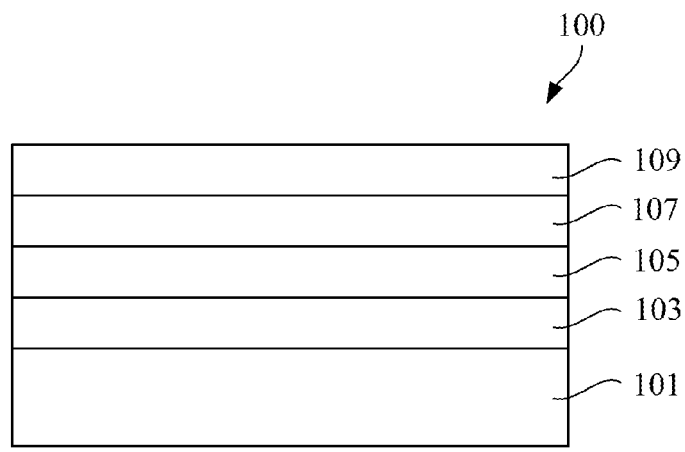

Referring to FIGS. 1A-1C, a portion of a substrate 101 is shown having a first dielectric layer 103 formed thereon. The substrate 101 may be formed of silicon, although it may also be formed of other group III, group IV, and/or group V elements, such as germanium, gallium, arsenic, and combinations thereof. The substrate 101 may also be in the form of silicon-on-insulator (SOI). Generally, an SOI substrate comprises a layer of a semiconductor material (e.g., silicon, germanium and/or the like) formed on an insulator layer. The insulator layer may be, for example, a buried oxide (BOX) layer or a silicon oxide layer. In addition, other substrates that may be used include multi-layered substrates, gradient substrates, hybrid orientation substrates, any combinations thereof and/or the like.

The first dielectric layer 103 is formed over the substrate 101. The first dielectric layer 103 may comprise an oxide or another dielectric material. The first dielectric layer 103 may comprise, for example, $SiO_2$, $Al_2O_3$, or the like, and may be formed by, for example, chemical vapor deposition (CVD), plasma enhanced chemical vapor deposition (PECVD), atomic layer deposition (ALD), or the like. In some embodiments, the first dielectric layer 103 is configured to electrically isolate the semiconductor device 100 from other devices formed on the substrate 101.

In some embodiments, the substrate 101 is an SOI substrate and the first dielectric layer 103 is formed over a top semiconductor layer of the SOI substrate. In other embodiments, the substrate 101 is a bottom semiconductor layer of an SOI substrate and the first dielectric layer 103 is a buried oxide (BOX) layer of the SOI substrate. In such embodiments, the top semiconductor layer of the SOI substrate is removed to expose the BOX layer.

FIGS. 1A-1C further illustrate formation of a first source/drain layer 105 on the first dielectric layer 103, a channel layer 107 over the first source/drain layer 105, and a second source/drain layer 109 over the channel layer 107. In some embodiments, the first source/drain layer 105, the channel layer 107, and the second source/drain layer 109 may be formed of silicon, although they may also be formed of other group III, group IV, and/or group V elements, such as germanium, gallium, arsenic, tin, and combinations thereof, and may be formed using CVD, low-pressure CVD (LP-CVD), ALD, or the like. In some embodiments, the first source/drain layer 105, the channel layer 107, and the second source/drain layer 109 may be formed of a same material. In other embodiments, the first source/drain layer 105 and the second source/drain layer 109 may be formed of a same material that is different from the channel layer 107. In such embodiments, the channel layer 107 may be strained to achieve high carrier mobility in the channel layer 107. In some embodiments, wherein the semiconductor device 100 is an n-type FET (nFET), the first source/drain layer 105 and the second source/drain layer 109 may be formed of SiGe and the channel layer 107 may be formed of Ge. In such embodiments, the channel layer 107 is subjected to a compressive stress along an in-plane (horizontal) direction and to a tensile stress along a channel (vertical) direction. In some embodiments, wherein the semiconductor device 100 is a p-type FET (pFET), the first source/drain layer 105 and the second source/drain layer 109 may be formed of GeSn and the channel layer 107 may be formed of Ge. In such embodiments, the channel layer 107 is subjected to a tensile stress along an in-plane (horizontal) direction and to a compressive stress along a channel (vertical) direction. In yet other embodiments, the first source/drain layer 105, the channel layer 107, and the second source/drain layer 109 may be formed of different materials.

In some embodiments, the first source/drain layer 105 has a thickness between about 5 nm and about 100 nm, such as about 10 nm, the channel layer 107 has a thickness between about 1 nm and about 40 nm, such as about 10 nm, and the second source/drain layer 109 has a thickness between about 5 nm and about 100 nm, such as about 10 nm. As described below in greater detail, the thickness of the channel layer 107 determines a channel length of the semiconductor device 100. Accordingly, the channel length is controlled by various deposition methods that may be used to form the channel layer 107.

Referring further to FIG. 1A-1C, in some embodiments, the first source/drain layer 105, the second source/drain layer 109, and the channel layer 107 may be doped to achieve desired doping levels for the first source/drain layer 105, the second source/drain layer 109, and the channel layer 107. In some embodiments, the first source/drain layer 105, the second source/drain layer 109, and the channel layer 107 may be in situ doped while forming the first source/drain layer 105, the second source/drain layer 109, and the channel layer 107, respectively. In other embodiments, the first source/drain layer 105, the second source/drain layer 109, and the channel layer 107 may be doped using, for example, ion implantation, or the like, after forming the first source/drain layer 105, the second source/drain layer 109, and the channel layer 107, respectively. In some embodiments wherein the first source/drain layer 105, the second source/drain layer 109, and the channel layer 107 are formed of germanium (Ge), the first source/drain layer 105, the second source/drain layer 109, the channel layer 107 may be n-doped using phosphorus, arsenic, or the like. In some embodiments wherein the first source/drain layer 105, the second source/drain layer 109, and the channel layer 107 are formed of Ge, the first source/drain layer 105, the second source/drain layer 109, and the channel layer 107 may be p-doped using boron, or the like. In some embodiments wherein the semiconductor device 100 is an nFET, the first source/drain layer 105 and the second source/drain layer 109 may have a carrier (electron) concentration between about $1E18$ cm$^{-3}$ and about $1E21$ cm$^{-3}$, such as about $2E19$ cm$^{-3}$, and the channel layer 107 may have a carrier (electron) concentration between about $2.4E13$ cm$^{-3}$ and about $1E20$ cm$^{-3}$. In other embodiments, the channel layer 107 may not be doped and may have an intrinsic carrier concentration of about $2.4E13$ cm$^{-3}$.

Figure 2A:
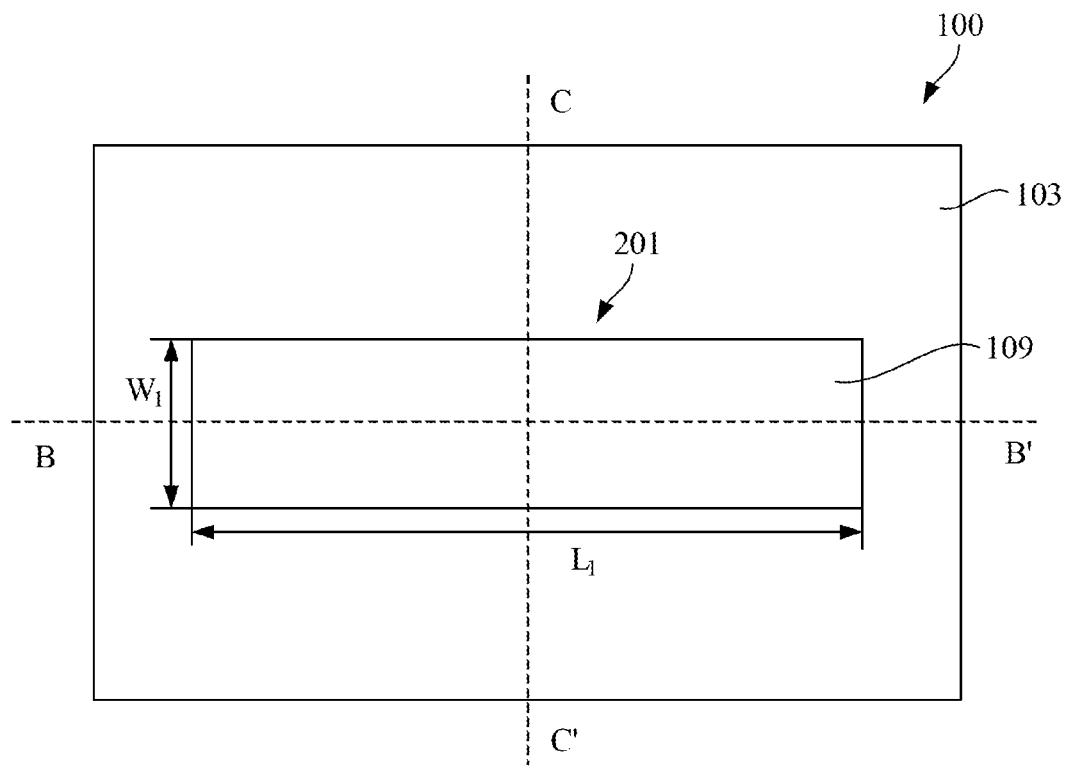
Figure 2B:
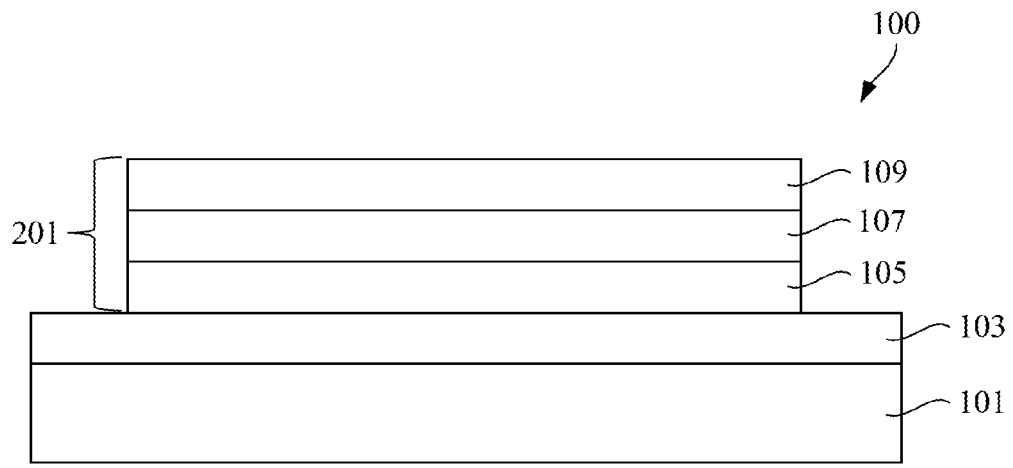
Figure 2C:
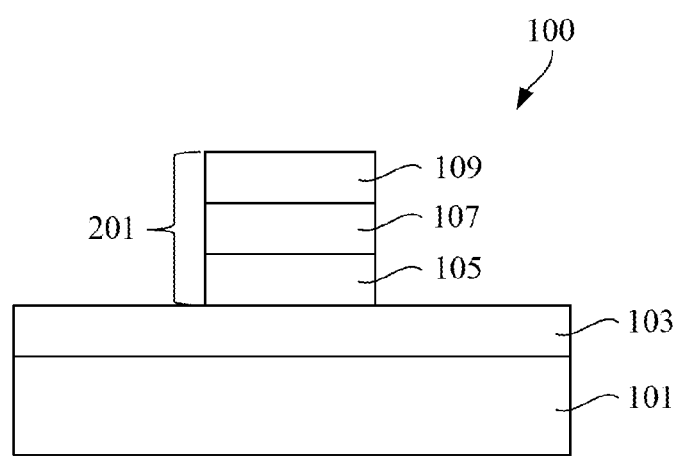

Referring to FIGS. 2A-2C, a stack of the first source/drain layer 105, the channel layer 107, and the second source/drain layer 109 is patterned to form a fin-shaped structure 201. In the illustrated embodiment, the fin-shaped structure 201 comprises a fin-shaped channel region 107 sandwiched between a first fin-shaped source/drain region 105 and a second fin-shaped source/drain region 109. In some embodiments, the stack of the first source/drain layer 105, the channel layer 107, and the second source/drain layer 109 may be patterned using photolithography techniques. Generally, photolithography involves depositing a photoresist material (not shown), which is then masked, exposed, and developed. After the photoresist mask is patterned, one or more etching process may be performed to remove unwanted portions of the underlying material. Additional masks (not shown), for example, hard masks, may be utilized in the one or more etching processes. Subsequently, excess portions of the photoresist material may be removed using, for example, an ashing process combined with a wet clean process.

In some embodiments wherein the first source/drain layer 105, the channel layer 107, and the second source/drain layer 109 are formed of Ge, the stack of the first source/drain layer 105, the channel layer 107, and the second source/drain layer 109 may be etched using a single etching process such as for example, a reactive ion etching process using $CF_4$ plasma. In other embodiments wherein the first source/drain layer 105, the channel layer 107, and the second source/drain layer 109 are formed of different materials, the stack of the first source/drain layer 105, the channel layer 107, and the second source/drain layer 109 may be etched using multiple etching processes such that each of multiple etching processes etches a corresponding individual layer of the stack. In some embodiments, the fin-shaped structure 201 has a length $L_1$ between about 10 nm and about 100 nm, and a width $W_1$ between about 1 nm and about 40 nm.

Figure 3A:
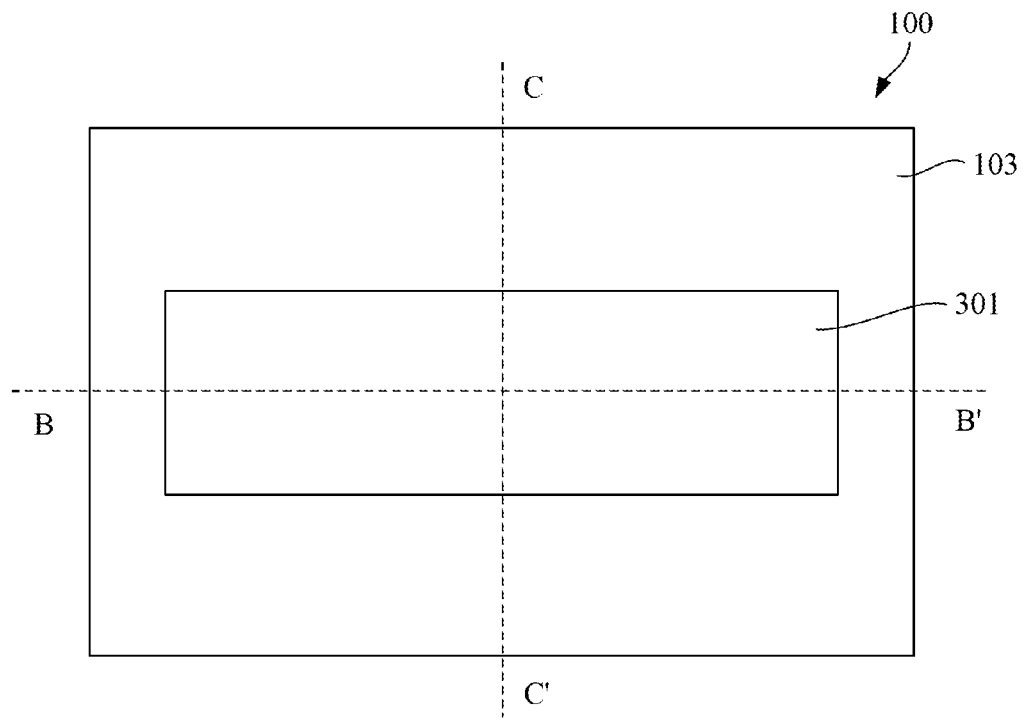
Figure 3B:
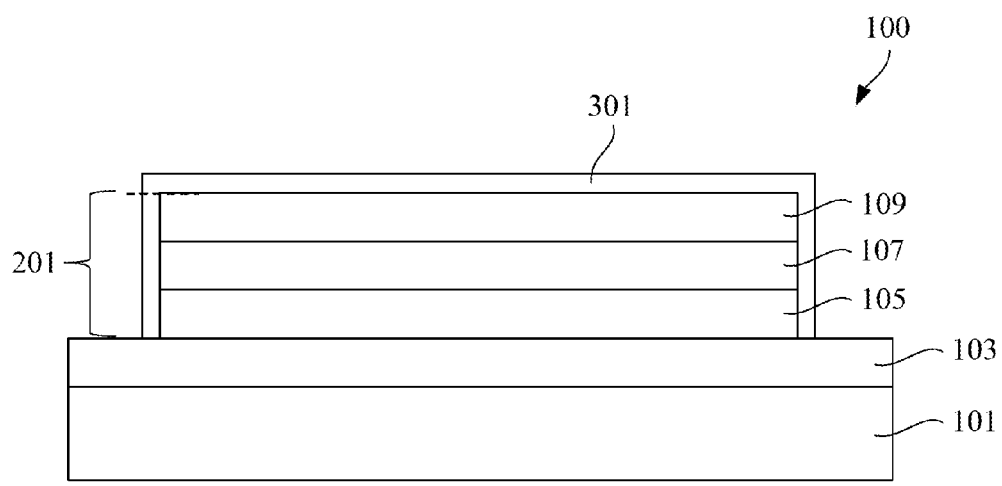
Figure 3C:
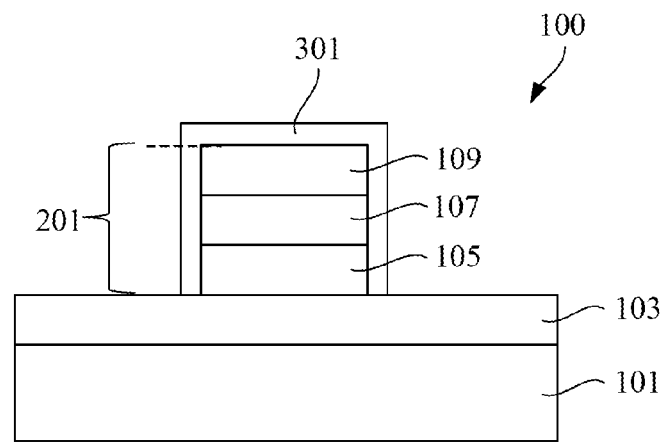

Referring to FIGS. 3A-3C, a gate dielectric layer 301 is conformally formed over the first dielectric layer 103 and the fin-shaped structure 201. In some embodiments, the gate dielectric layer 301 comprises one or more layers of high-k dielectric materials. Generally, a high-k dielectric material has a dielectric constant (k-value) higher than 3.9. For example, the gate dielectric layer 301 may include one or more layers of a metal oxide or a silicate of Hf, Al, Zr, combinations thereof, and multi-layers thereof. Other suitable materials include La, Mg, Ba, Ti, Pb, Zr, in the form of metal oxides, metal alloyed oxides, or combinations thereof. Exemplary materials include $MgO_x$, $BaTi_xO_y$, $BaSr_xTi_yO_z$, $PbTi_xO_y$, $PbZr_xTi_yO_z$, or the like. In some embodiments, the gate dielectric layer 301 may be formed using ALD, CVD, PECVD, molecular-beam deposition (MBD), or the like. In some embodiments, the gate dielectric layer 301 has an equivalent oxide thickness (EOT) between about 0.1 nm and about 5 nm, such as about 0.8 nm.

Referring further to FIGS. 3A-3C, in some embodiments, the gate dielectric layer 301 is patterned to remove portions of the gate dielectric layer 301 that are disposed over the first dielectric layer 103. In some embodiments, the gate dielectric layer 301 may be patterned using suitable lithography and etching methods. In the illustrated embodiment, after the patterning process, the gate dielectric layer remains only on sidewalls and a top surface of the fin-shaped structure 201. In other embodiments, after the patterning process, the gate dielectric layer 301 may remain on the sidewalls and the top surface of the fin-shaped structure 201 as well as cover portions of the first dielectric layer 103.

Figure 4A:
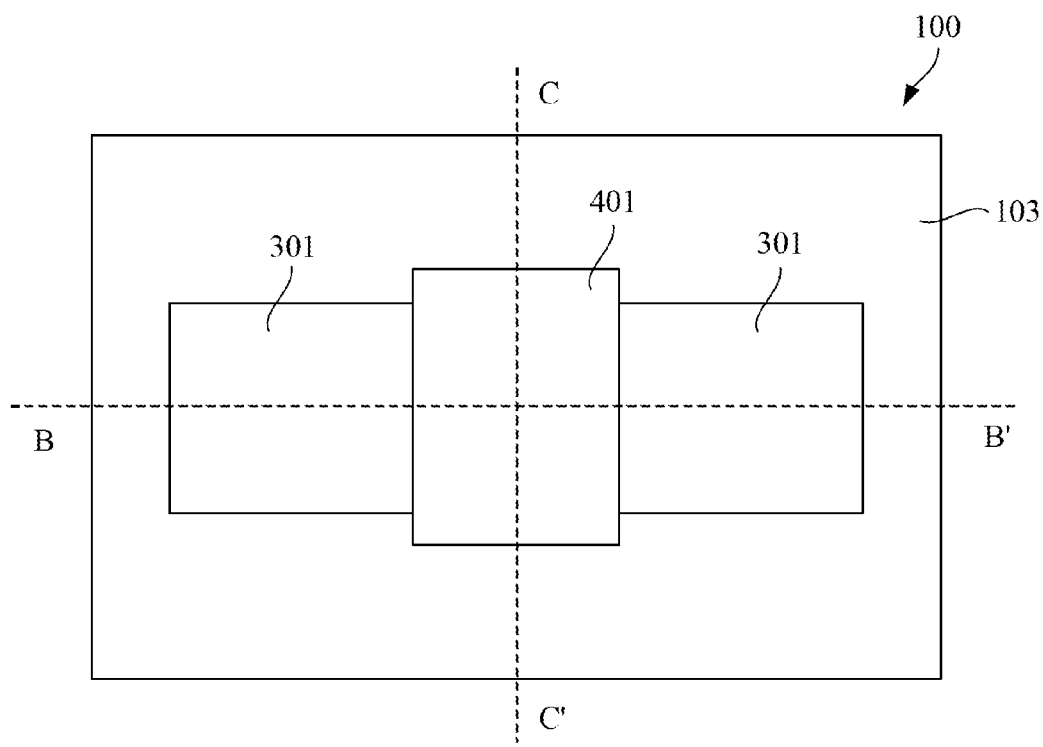
Figure 4B:
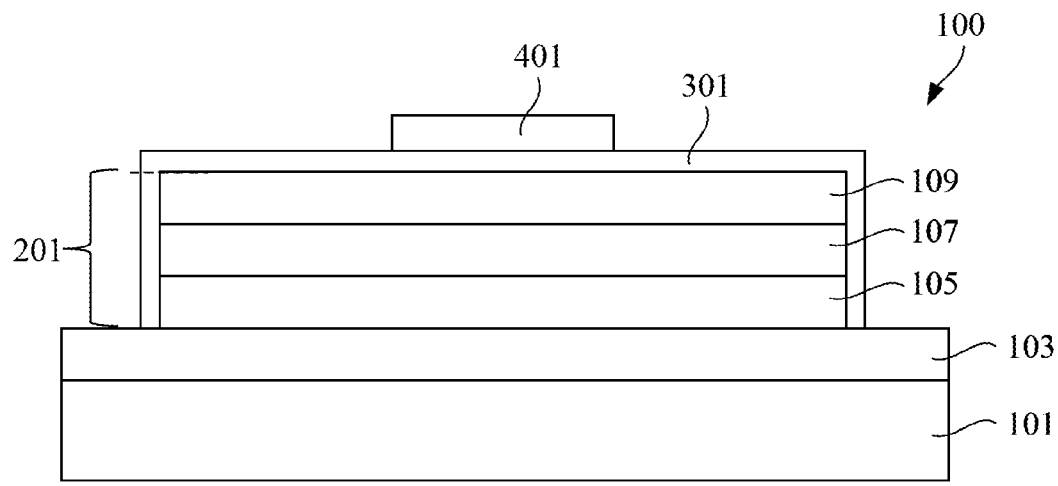
Figure 4C:
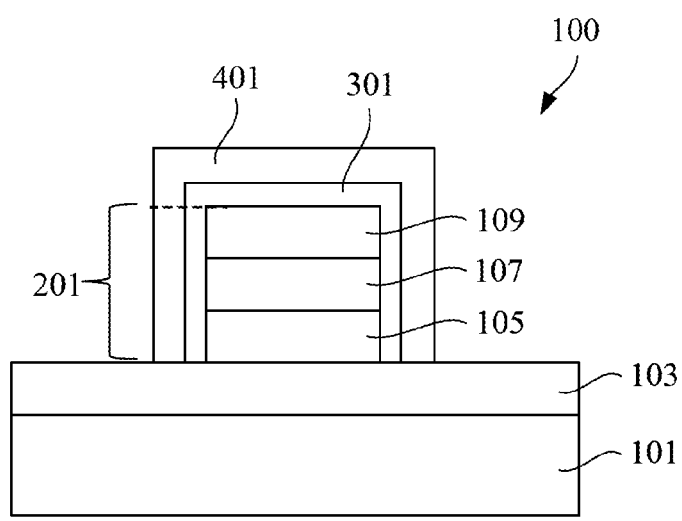

Referring to FIGS. 4A-4C, a gate electrode layer 401 is conformally formed over the gate dielectric layer 301 and the first dielectric layer 103. In some embodiments, the gate electrode layer 401 may comprise a metallic material such as gold, silver, aluminum, copper, tungsten, molybdenum, nickel, titanium, or alloys thereof, and may be formed using physical vapor deposition (PVD), ALD, plating, or the like. In some embodiments, the gate electrode layer 401 may have a thickness between about 1 nm and about 100 nm. Subsequently, the gate electrode layer 401 is patterned such that the gate electrode layer 401 wraps around a middle portion of the fin-shaped structure 201. In some embodiments, the gate electrode layer 401 may be patterned using suitable lithography and etching methods.

Figure 5A:
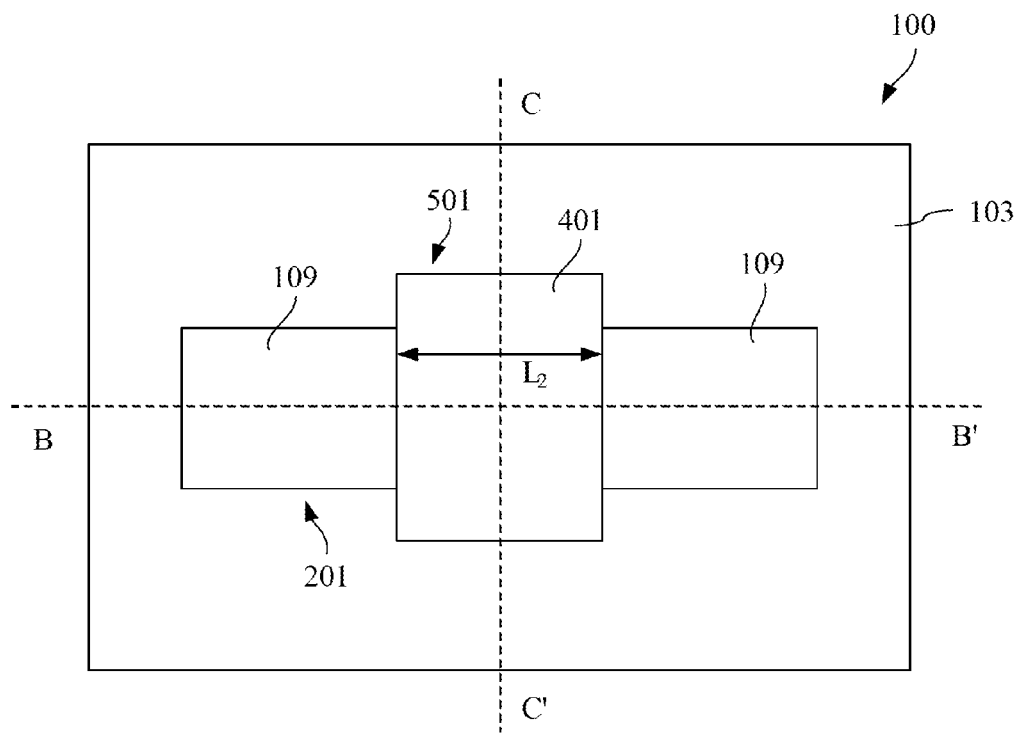
Figure 5B:
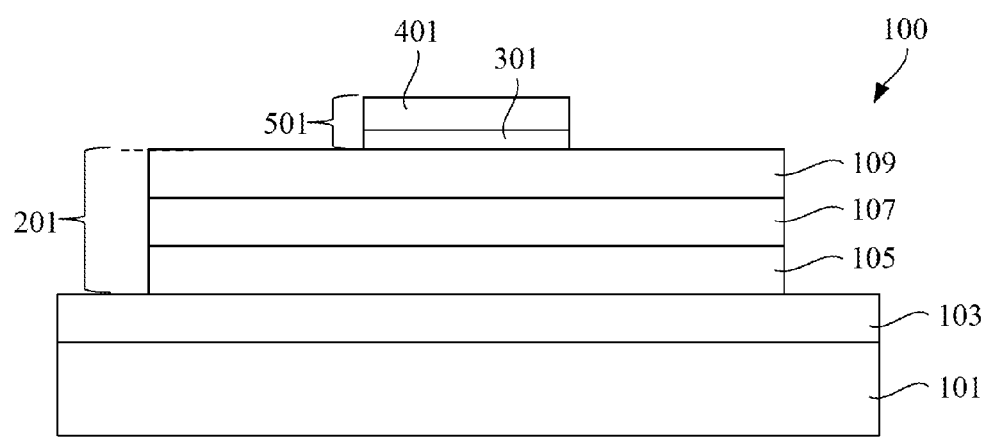
Figure 5C:
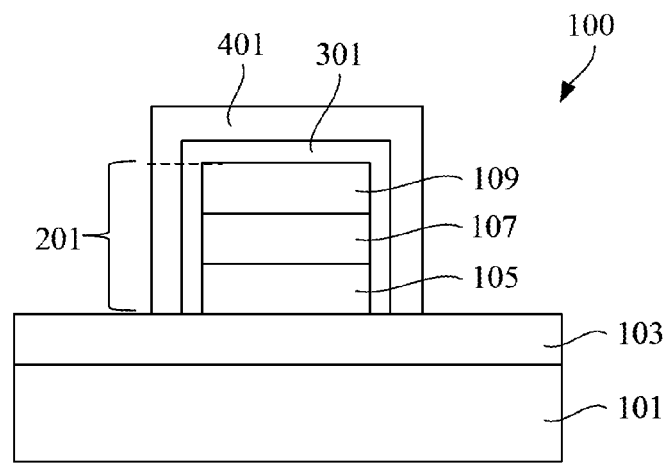

Referring to FIGS. 5A-5C, the gate dielectric layer 301 is patterned to remove exposed portions of the gate dielectric layer 301. In some embodiments, the gate dielectric layer 301 may be patterned using a suitable etching process, while using the gate electrode layer 401 as a mask. In other embodiments, the gate dielectric layer 301 may be patterned using other suitable methods. In what follows, a stack of the gate dielectric layer 301 and the gate electrode layer 401 may be also referred to as a gate stack 501. In some embodiments, the gate stack 501 has a length $L_2$ between about 1 nm and about 40 nm, such as about 20 nm.

Figure 6A:
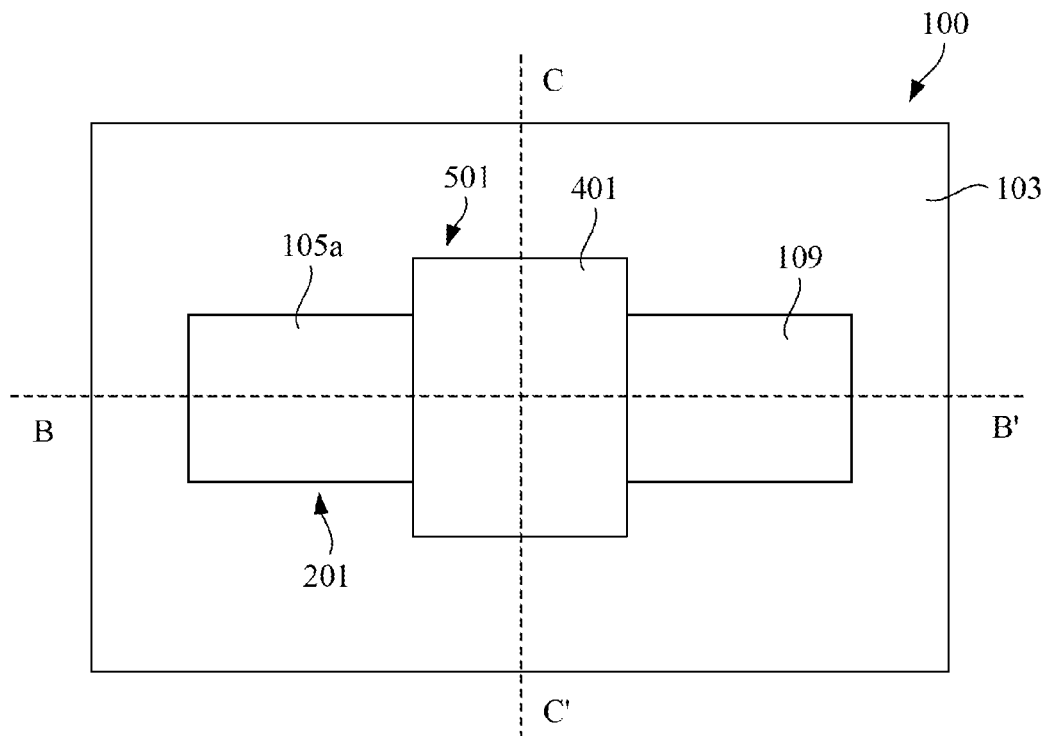
Figure 6B:
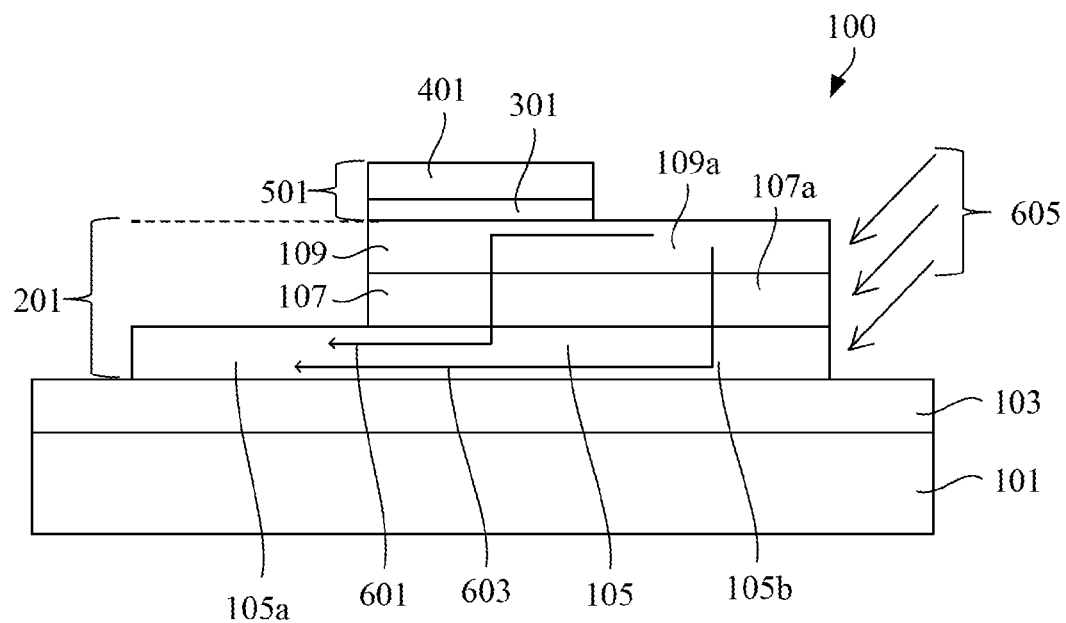
Figure 6C:
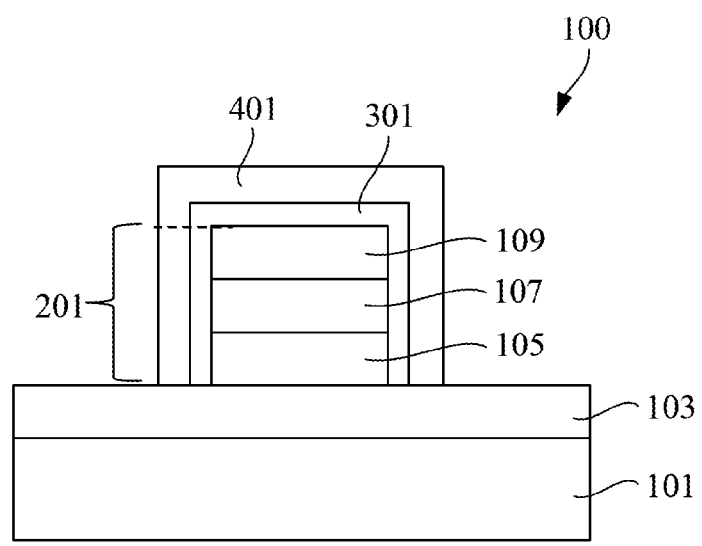

Referring to FIGS. 6A-6C, the second source/drain layer 109 and the channel layer 107 are patterned to expose a portion 105a of the first source/drain layer 105. As described below in greater detail, the portion 105a of the first source/drain layer 105 will be used as a landing pad for a subsequently formed contact plug. In some embodiments, the second source/drain layer 109 and the channel layer 107 may be patterned using methods that are similar to those forming the fin-shaped structure 201, described above with reference to FIGS. 2A-2C, and the description is not repeated herein.

Referring further to FIGS. 6A-6C, in the illustrated embodiment, the gate stack 501 is formed on sidewalls of the first source/drain layer 105 and on sidewalls and a top surface of the second source/drain layer 109. In some embodiment, such an arrangement allows for gating the first source/drain layer 105 and the second source/drain layer 109 and, therefore, allows for carrier density modulation in the first source/drain layer 105 and the second source/drain layer 109. By properly gating the first source/drain layer 105 and the second source/drain layer 109, an on-state drain current $I_{ON}$ can be increased and an off-state leakage current $I_{OFF}$ can be decreased. For example, an arrow 601 in FIG. 6B illustrates a main path for the on-state drain current $I_{ON}$, and an arrow 603 in FIG. 6B illustrates a main path for the off-state leakage current $I_{OFF}$. By gating the first source/drain layer 105 and the second source/drain layer 109 such that carrier density is increased (charge is accumulated) in the first source/drain layer 105 and the second source/drain layer 109, a series resistance between the first source/drain layer 105, the channel layer 107 and the second source/drain layer 109 is decreased, which in turn increases the on-state drain current $I_{ON}$. On the other hand, by gating the first source/drain layer 105 and the second source/drain layer 109 such that carrier density is decreased (charge is depleted) in the first source/drain layer 105 and the second source/drain layer 109, a resistance along the leakage path is increased, which in turn decreases the off-state leakage current $I_{OFF}$. Moreover, carrier depletion of the first source/drain layer 105 and the second source/drain layer 109 increases an effective gate length. In some embodiments, the semiconductor device 100 may have the on-state drain current $I_{ON}$ of about 2400 µA/µm for a drain voltage $V_{DS}$ of about 1 V and a gate voltage $V_{GS}$ of about 1 V, a subthreshold swing (SS) of about 78 mV/dec, and a drain induced barrier lowering (DIBL) of about 80 mV/V.

Referring further to FIGS. 6A-6C, an additional doping process 605 may be performed on portions 105b, 107a, and 109a of the first source/drain layer 105, the channel layer 107, and the second source/drain layer 109, respectively, that are not protected by the gate stack 501. In the illustrated embodiment, the portions 105b, 107a, 109a and the portion 105a are located on opposite sides of the gate stack 501. In some embodiments, the additional doping process 605 may be an ion implantation process, or the like. In some embodiments wherein the first source/drain layer 105, the second source/drain layer 109 and the channel layer 107 are formed of Ge, the portions 105b, 107a and 109a may be n-doped using phosphorus, arsenic, or the like. In some embodiments wherein the first source/drain layer 105, the second source/drain layer 109 and the channel layer 107 are formed of Ge, the portions 105b, 107a and 109a may be p-doped using boron, or the like. In some embodiments wherein the first source/drain layer 105, the second source/drain layer 109, and the channel layer 107 are n-doped, the additional doping process 605 is performed on the portions 105b and 107a such that the portions 105b and 107a form a single p-doped region. Accordingly, the portion 109a remains n-doped. In some embodiments, the p-doped region may have a carrier (hole) concentration between about $2.4E13$ $cm^{-3}$ and about $1E20$ $cm^{-3}$, such as about $1.2E18$ $cm^{-3}$. In other embodiments wherein the first source/drain layer 105, the second source/drain layer 109, and the channel layer 107 are n-doped, the additional doping process 605 is performed on the portion 105b of the first source/drain layer 105 to form a p-doped region. Accordingly, the portions 107a and 109a remain n-doped. In yet other embodiments wherein the first source/drain layer 105, the second source/drain layer 109, and the channel layer 107 are n-doped, the additional doping process 605 is performed on the portion 107a of the channel layer 107 to form a p-doped region. Accordingly, the portions 105b and 109a remain n-doped. In some embodiments, by performing the additional doping process 605, characteristics of the semiconductor device 100 may be improved. In some embodiments, the off-state leakage current $I_{OFF}$ and the SS can be further decreased. For example, in some embodiments wherein the portions 105b and 107a form a single p-doped region, the semiconductor device 100 may have the SS of about 68 mV/dec.

Referring further to FIGS. 6A-6C, in the illustrated embodiment, the additional doping process 605 is performed after patterning the fin-shaped structure 201 to expose the portion 105a of the first source/drain layer 105. In other embodiments, the additional doping process 605 may be performed after forming the gate stack 501, as described above with reference to FIGS. 3A-5C, but before patterning the fin-shaped structure 201. In yet other embodiments, the additional doping process 605 may be performed after the initial doping process, as described above with reference to FIGS. 1A-1C, but before forming the gate stack 501.

Figure 7A:
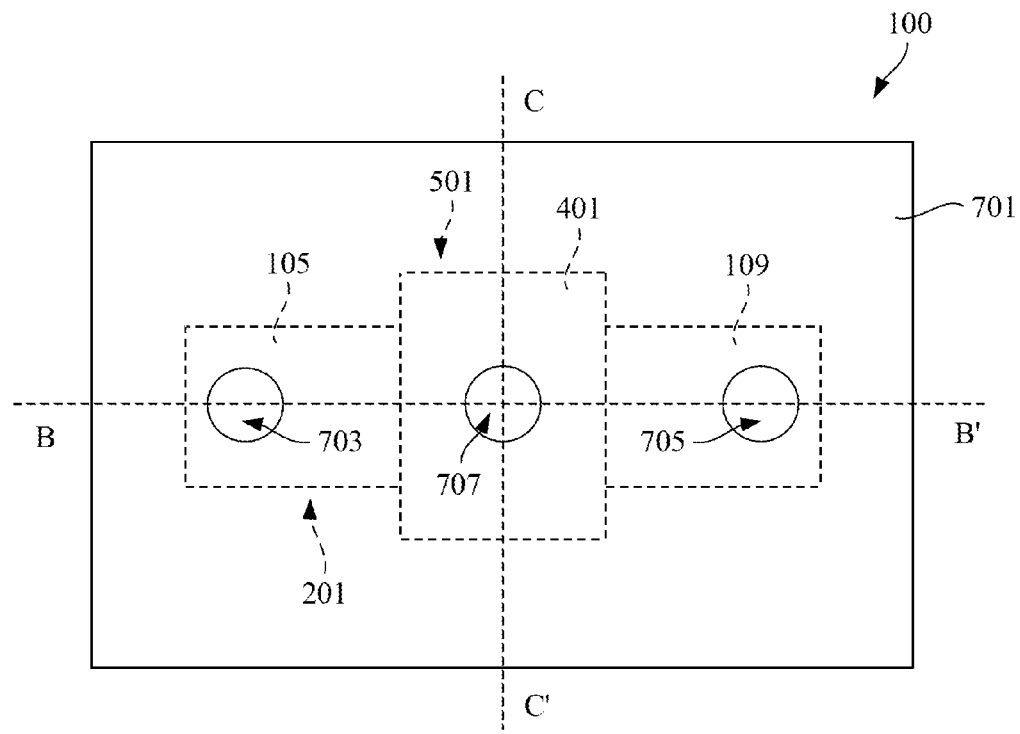
Figure 7B:
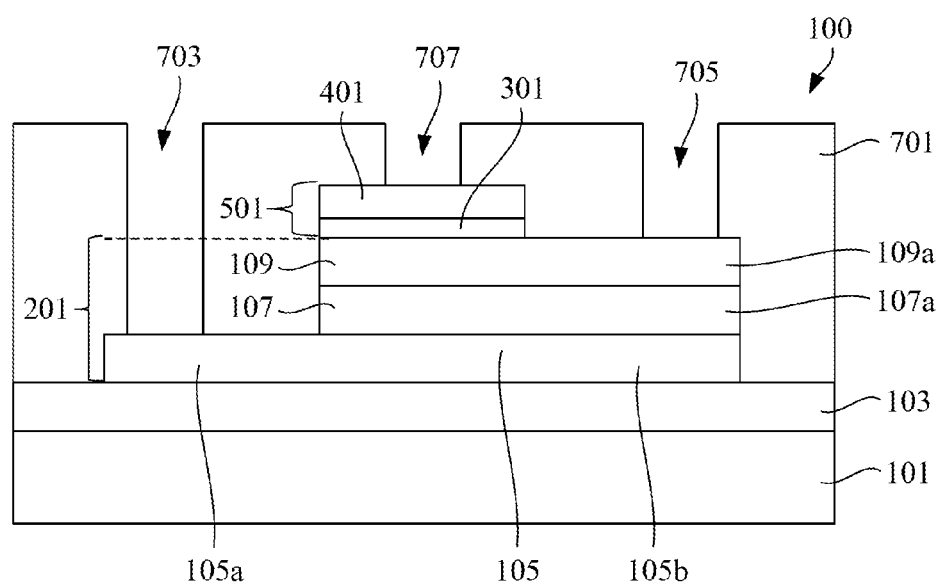
Figure 7C:
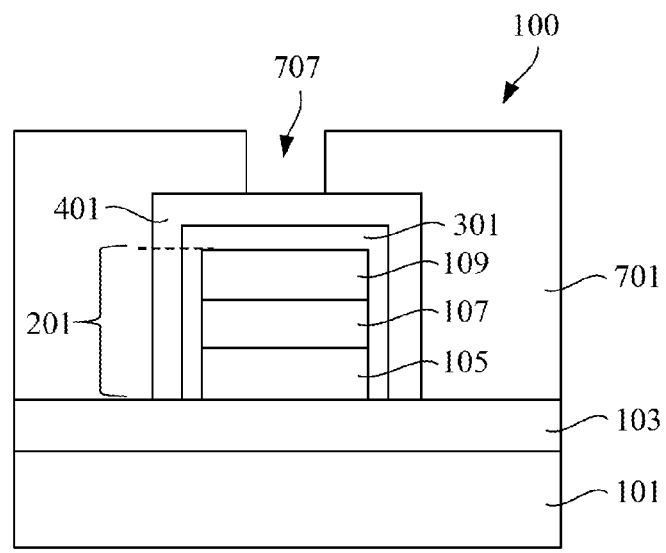

Referring to FIGS. 7A-7C, a second dielectric layer 701 is formed over the fin-shaped structure 201 and the gate stack 501. In some embodiments, the second dielectric layer 701 may comprise silicon oxide, silicon nitride, silicon oxynitride, fluoride-doped silicate glass (FSG), low-k dielectrics such as carbon doped oxides, extremely low-k dielectrics such as porous carbon doped silicon oxide, combinations of these, or the like, and may be formed using, for example, chemical vapor deposition (CVD), a spin-on process, a thermal oxidation process, or the like. In some embodiments, excess portions of the dielectric material may be removed from the second dielectric layer 701 using, for example, an etch process, a grinding process, a chemical mechanical polishing (CMP) process, or the like. In some embodiments, the second dielectric layer 701 may isolate the semiconductor device 100 from other devices formed on the substrate 101. Moreover, as described below in greater detail, contact plugs will be formed in the second dielectric layer 701 to provide electrical connections to the first source/drain layer 105, the second source/drain layer 109, and the gate stack 501. The second dielectric layer 701 may be also referred to as an inter-layer dielectric (ILD) layer.

Referring further to FIGS. 7A-7C, a first opening 703, a second opening 705 and a third opening 707 are formed in the second dielectric layer 701 to expose the first source/drain layer 105, the second source/drain layer 109 and the gate electrode layer 401, respectively. In the illustrated embodiment, the first openings 703 exposes the portion 105a of the first source/drain layer 105 and the second opening 705 exposes the portion 109a of the second source/drain layer 109. In some embodiments, the first opening 703, the second opening 705 and the third opening 707 may be formed using suitable lithography and etching techniques.

Figure 8A:
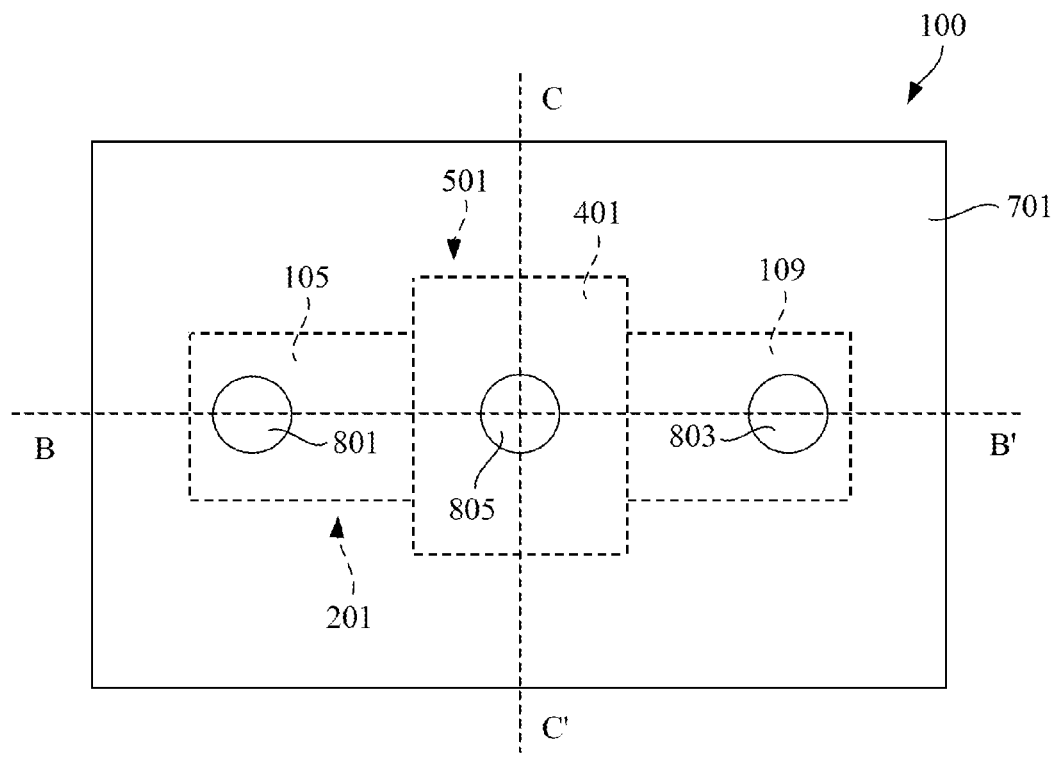
Figure 8B:
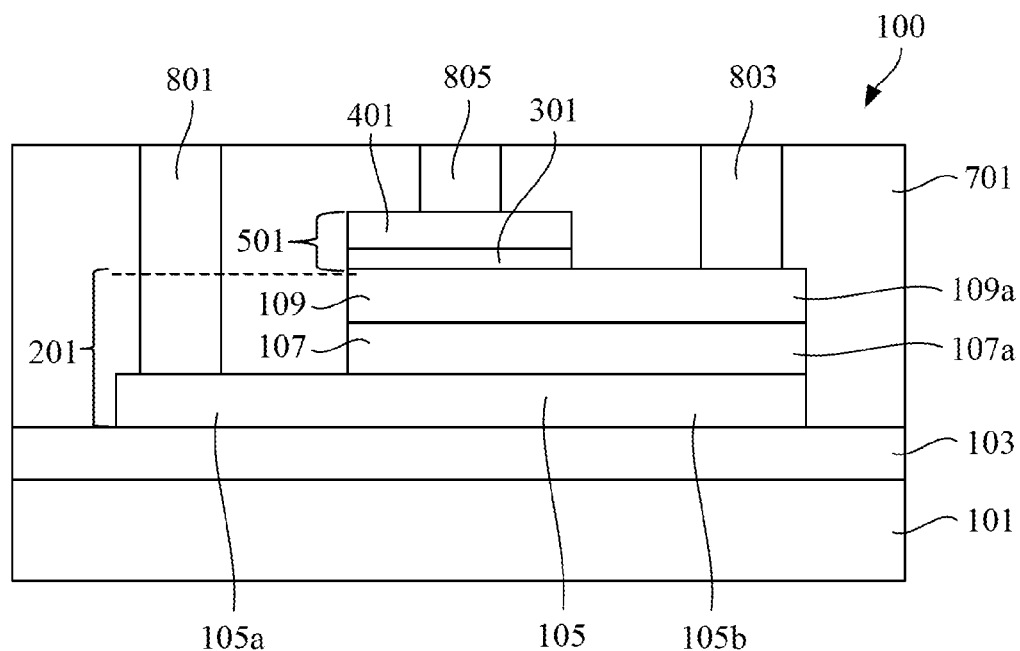
Figure 8C:
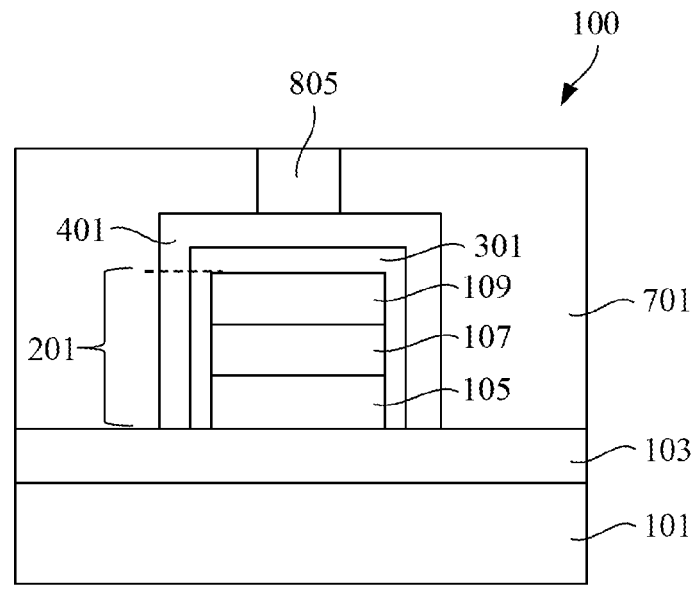

Referring to FIGS. 8A-8C, a first contact plug 801, a second contact plug 803, and a third contact plug 805 are formed in the first opening 703, the second opening 705, and the third opening 707, respectively. In the illustrated embodiment, the first contact plug 801 provides an electrical connection to the first source/drain layer 105, the second contact plug 803 provides an electrical connection to the second source/drain layer 109, and the third contact plug 805 provides an electrical connection to the gate electrode layer 401 of the gate stack 501. In the illustrated embodiment, top-view shapes of the first contact plug 801, the second contact plug 803 and the third contact plug 805 are circles. However, in other embodiments, the top-view shapes of the first contact plug 801, the second contact plug 803 and the third contact plug 805 may be ovals, polygons such as triangles, rectangles, hexagons, or the like.

Referring further to FIGS. 8A-8C, in some embodiments, one or more barrier/adhesion layers (not shown) are conformally formed over the second dielectric layer 701 and in the first opening 703, the second opening 705, and the third opening 707. The one or more barrier/adhesion layers protect neighboring layers (such as, for example, the second dielectric layer 701) from metallic diffusion. The one or more barrier/adhesion layers may comprise titanium, titanium nitride, tantalum, tantalum nitride, or the like and may be formed using PVD, CVD, ALD, the like, or a combination thereof. In some embodiments, a seed layer (not shown) is conformally formed over the one or more barrier/adhesion layers. The seed layer may comprise copper, titanium, nickel, gold, manganese, the like, or a combination thereof, and may be formed by ALD, PVD, the like, or a combination thereof.

Subsequently, the first contact plug 801, the second contact plug 803, and the third contact plug 805 are formed by filling the first opening 703, the second opening 705, and the third opening 707, respectively, with a suitable conductive material. In some embodiments, the first contact plug 801, the second contact plug 803, and the third contact plug 805 may comprise copper, a copper alloy, silver, gold, tungsten, tantalum, aluminum, and the like, and may be formed using an electro-chemical plating process, an electroless plating process, ALD, PVD, the like, or a combination thereof.

In some embodiments, excess materials overfilling the first opening 703, the second opening 705 and the third opening 707 are removed such that topmost surfaces of the first contact plug 801, the second contact plug 803, and the third contact plug 805 are substantially coplanar with a topmost surface of the second dielectric layer 701. In some embodiments, the excess materials are removed using, for example, a mechanical grinding process, a CMP process, an etching process, the like, or a combination thereof.

In some embodiments, further manufacturing steps may be performed on the semiconductor device 100. For example, metallization layers (not shown) may be formed over the second dielectric layer 701. The metallization layers may comprise one or more dielectric layers, and one or more conductive features formed in the one or more dielectric layers. In some embodiments, the metallization layers are in electrical contact with the first contact plug 801, the second contact plug 803 and the third contact plug 805 and electrically interconnect the semiconductor device 100 to other devices formed on the substrate 101. In some embodiments, the further manufacturing steps may also include formation of one or more redistribution layers (RDLs) over the metallization layers, formation of under-bump metallizations (UBMs) over the RLDs, and formation of connectors over the UBMs. Subsequently, the substrate 101 may be singulated into separate dies, which may further undergo various packaging processes.

Figure 9A:
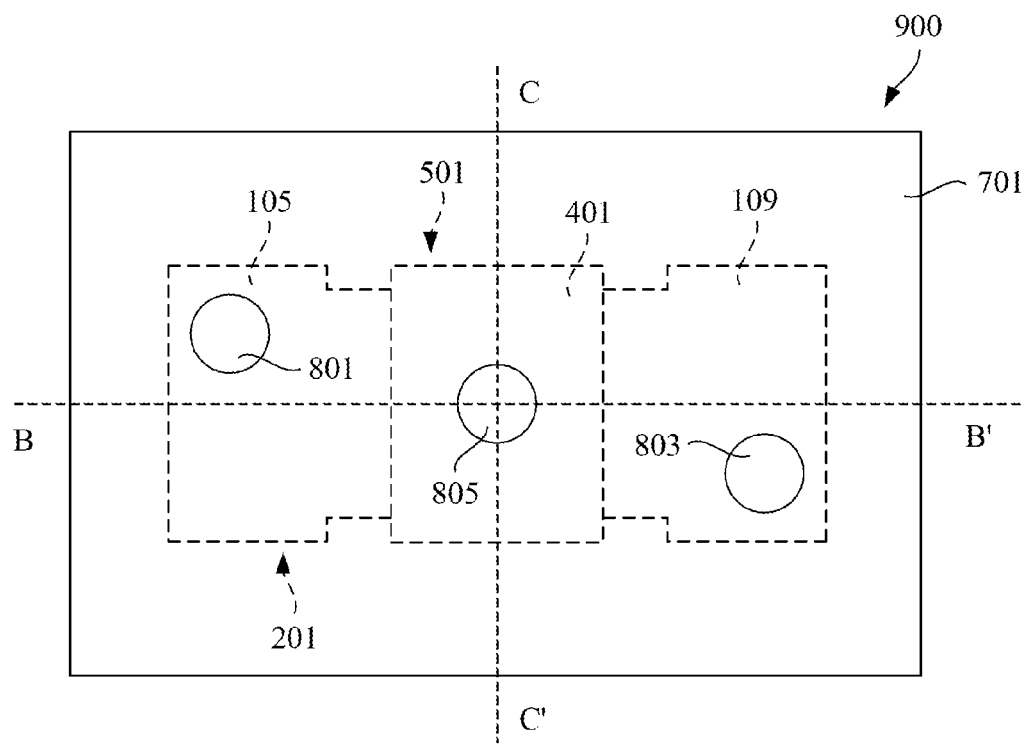
FIGS. 9A, 9B and 9C illustrate various top and cross-sectional views of a semiconductor device in accordance with some embodiments.
Figure 9B:
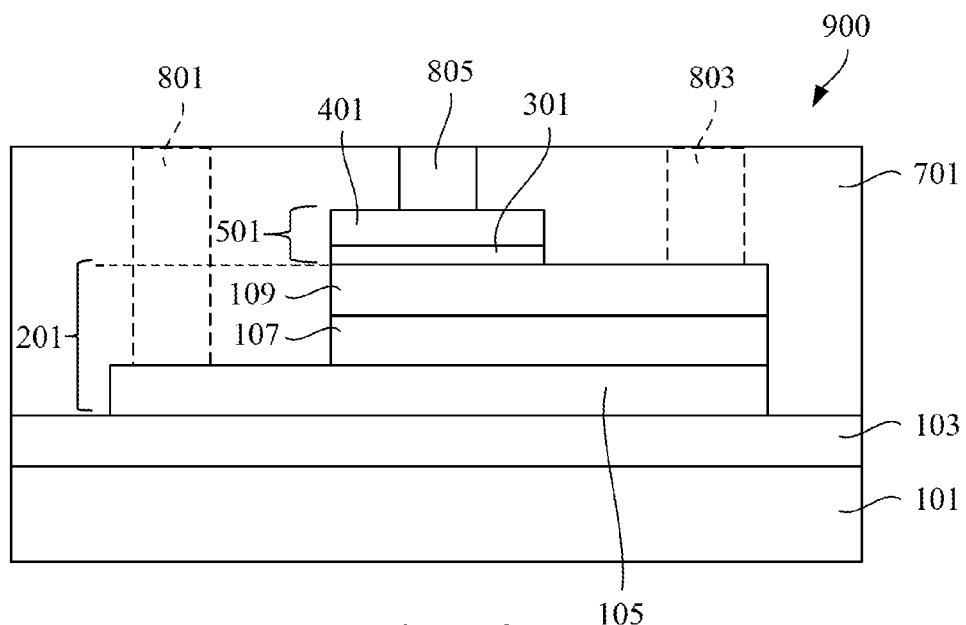
Figure 9C:
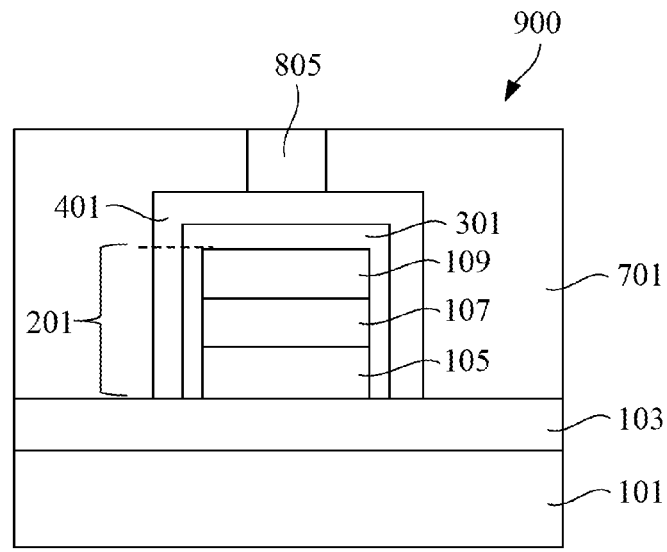

FIGS. 9A, 9B and 9C illustrate various top and cross-sectional views of a semiconductor device 900 in accordance with some embodiments. In particular, FIG. 9A illustrates a top view, FIG. 9B illustrates a first cross-sectional view along the B-B' line of FIG. 9A, and FIG. 9C illustrates a second cross-sectional view along the C-C' line (perpendicular to the B-B' line) of FIG. 9A. Moreover, various elements of FIGS. 9A-9C are depicted using dashed lines to indicate that such elements are invisible in top and cross-sectional views illustrated in FIGS. 9A-9C. In some embodiments, the semiconductor device 900 may be formed using similar materials and methods as the semiconductor device 100 described above with reference to FIGS. 1A-8C, with similar elements labeled by similar numerical references, and the description is not repeated herein. As described above with reference to FIGS. 1A-8C, the fin-shaped structure 201 of the semiconductor device 100 has a same with $W_1$ along the entire length. In the illustrated embodiment, end portions of the fin-shaped structure 201 of the semiconductor device 900 have greater widths than a middle portion of the fin-shaped structure 201 of the semiconductor device 900. In some embodiments, wider end portions of the fin-shaped structure 201 may provide more flexibility during formation of the first contact plug 801 and the second contact plug 803 as they allow for greater freedom in choosing locations for the first contact plug 801 and the second contact plug 803. As described above with reference to FIGS. 1A-8C, the first contact plug 801, the second contact plug 803 and the third contact plug 805 are formed along the line BB'. In the illustrated embodiment, the first contact plug 801 and the second contact plug 803 are formed on opposite sides of the line BB' and are not visible in FIG. 9B.

Figure 10A:
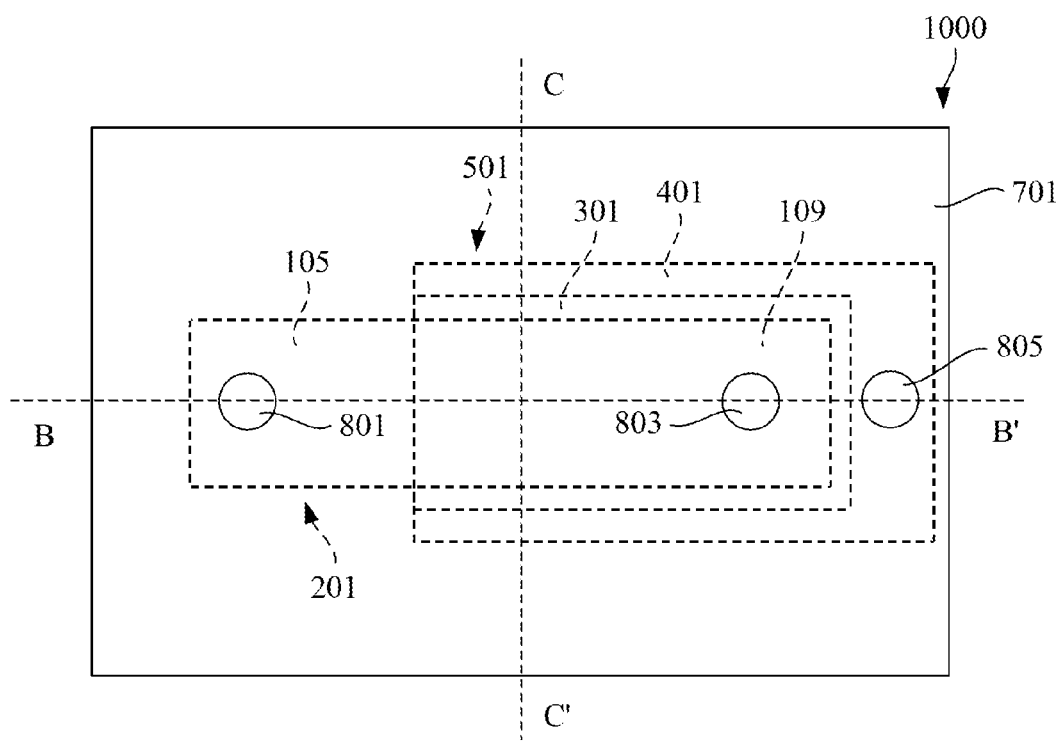
FIGS. 10A, 10B and 10C illustrate various top and cross-sectional views of a semiconductor device in accordance with some embodiments.
Figure 10B:
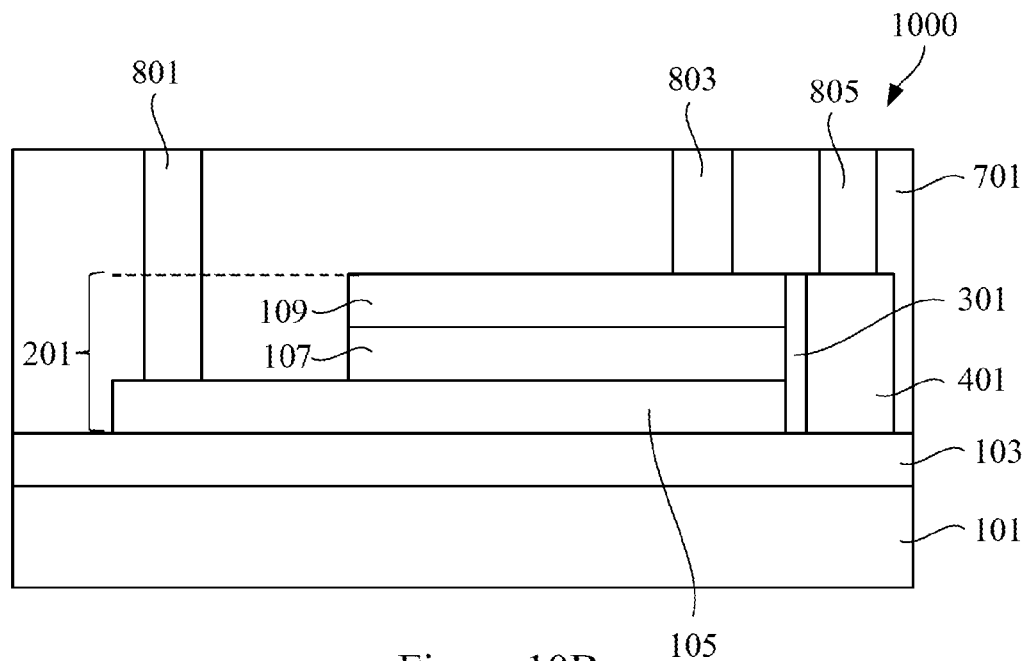
Figure 10C:
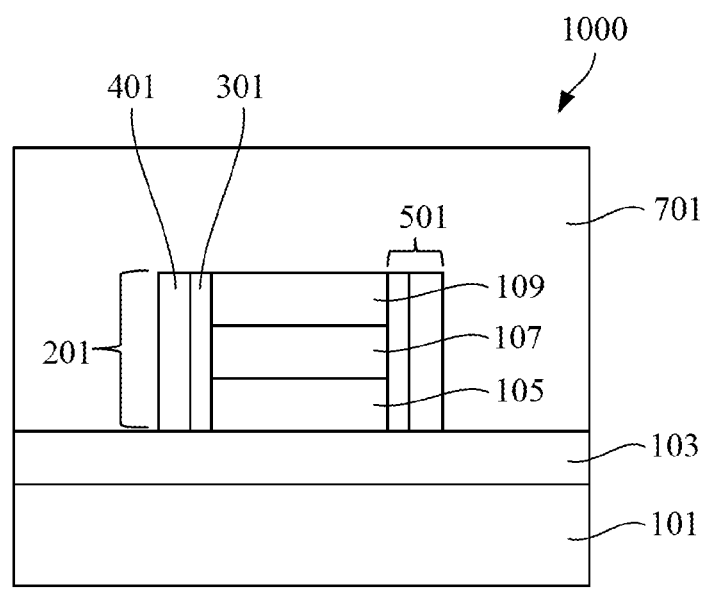

FIGS. 10A, 10B and 10C illustrate various top and cross-sectional views of a semiconductor device 1000 in accordance with some embodiments. In particular, FIG. 10A illustrates a top view, FIG. 10B illustrates a first cross-sectional view along the B-B' line of FIG. 10A, and FIG. 10C illustrates a second cross-sectional view along the C-C' line (perpendicular to the B-B' line) of FIG. 10A. Moreover, various elements of FIGS. 10A-10C are depicted using dashed lines to indicate that such elements are invisible in top and cross-sectional views illustrated in FIGS. 10A-10C. In some embodiments, the semiconductor device 1000 may be formed using similar materials and methods as the semiconductor device 100 described above with reference to FIGS. 1A-8C, with similar elements labeled by similar numerical references, and the description is not repeated herein. As described above with reference to FIGS. 1A-8C, the gate stack 501 of the semiconductor device 100 is formed on two sidewalls and the top surface of the fin-shaped structure 201. In the illustrated embodiment, the gate stack 501 is formed on three sidewalls of the fin-shaped structure 201 and does not extend over the fin-shaped structure 201, which may improve gating characteristics of the semiconductor device 1000.

Figure 11A:
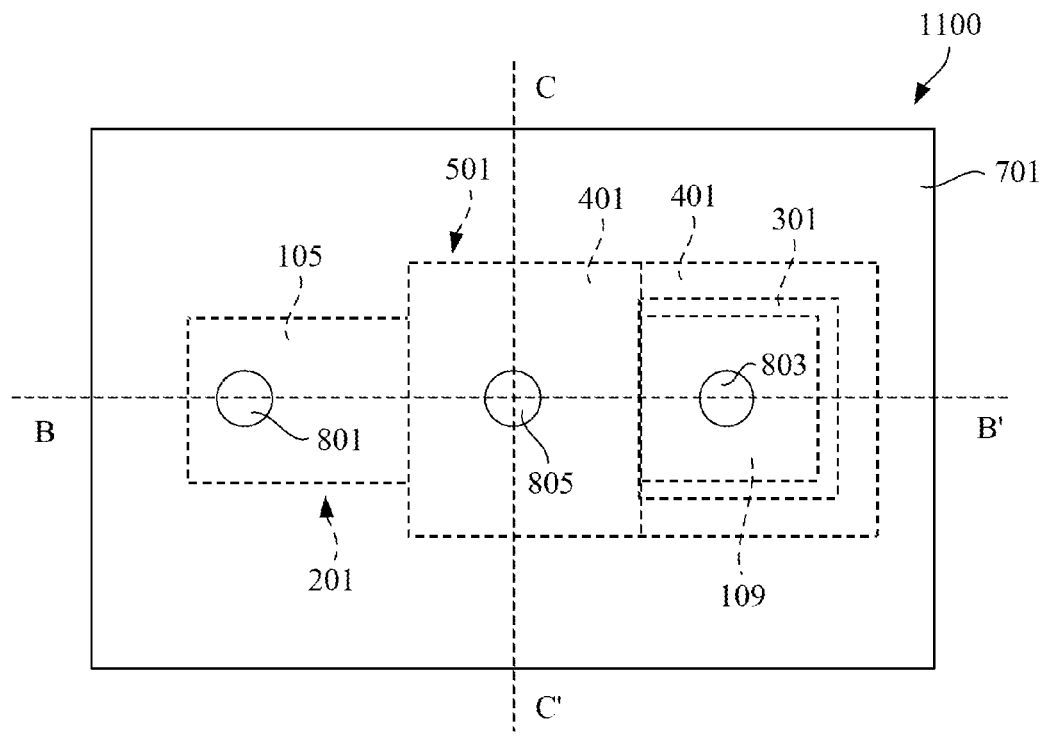
FIGS. 11A, 11B and 11C illustrate various top and cross-sectional views of a semiconductor device in accordance with some embodiments.
Figure 11B:
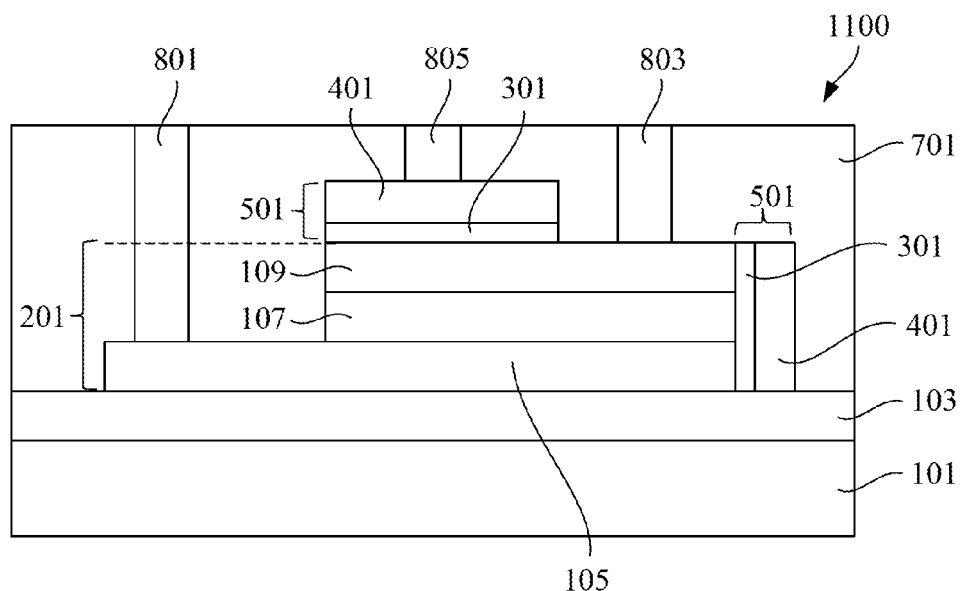
Figure 11C:
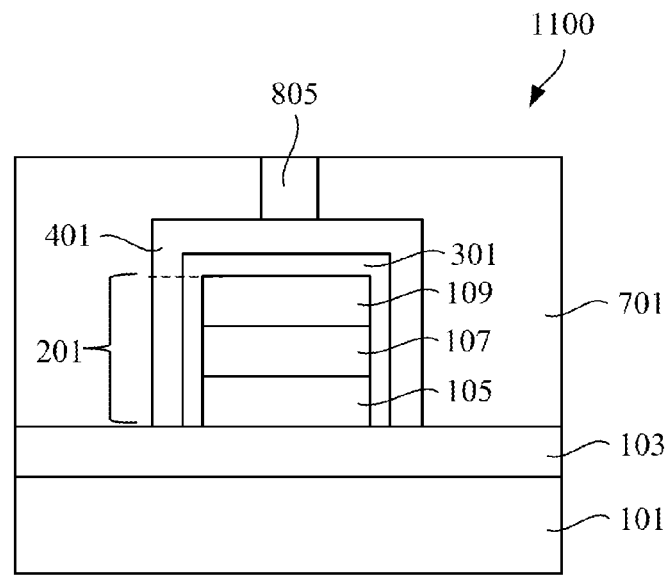

FIGS. 11A, 11B and 11C illustrate various top and cross-sectional views of a semiconductor device 1100 in accordance with some embodiments. In particular, FIG. 11A illustrates a top view, FIG. 11B illustrates a first cross-sectional view along the B-B' line of FIG. 11A, and FIG. 11C illustrates a second cross-sectional view along the C-C' line (perpendicular to the B-B' line) of FIG. 11A. Moreover, various elements of FIGS. 11A-11C are depicted using dashed lines to indicate that such elements are invisible in top and cross-sectional views illustrated in FIGS. 11A-11C. In some embodiments, the semiconductor device 1100 may be formed using similar materials and methods as the semiconductor device 100 described above with reference to FIGS. 1A-8C, with similar elements labeled by similar numerical references, and the description is not repeated herein. As described above with reference to FIGS. 1A-8C, the gate stack 501 of the semiconductor device 100 is formed on two sidewalls and the top surface of the fin-shaped structure 201. In the illustrated embodiment, the gate stack 501 is formed on three sidewalls and the top surface of the fin-shaped structure 201, which may improve gating characteristics of the semiconductor device 1100.

Figure 12A:
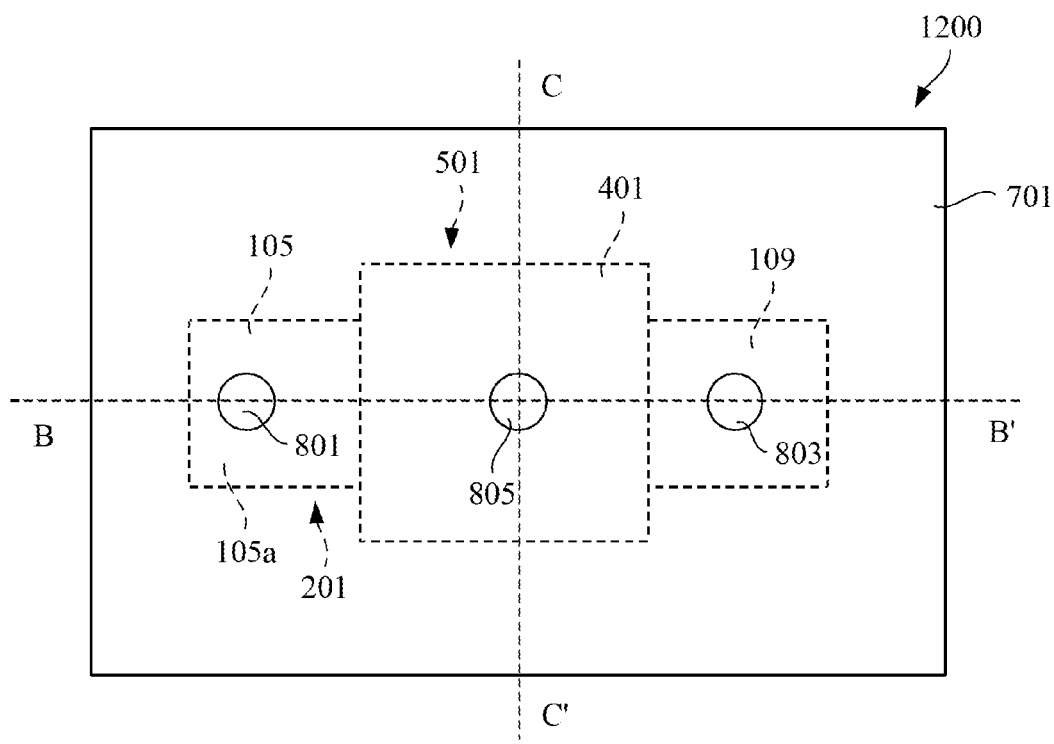
FIGS. 12A, 12B and 12C illustrate various top and cross-sectional views of a semiconductor device in accordance with some embodiments.
Figure 12B:
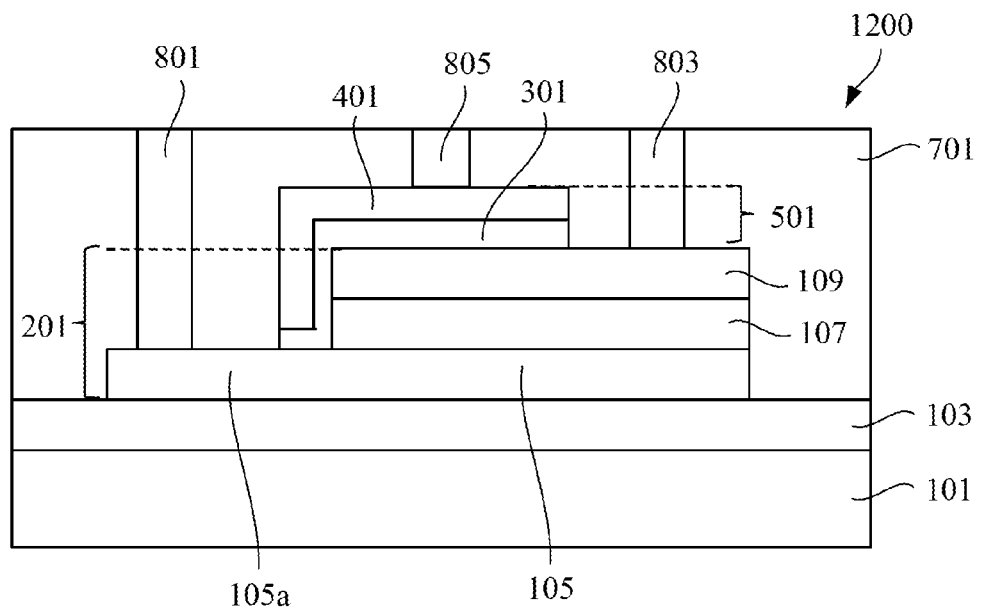
Figure 12C:
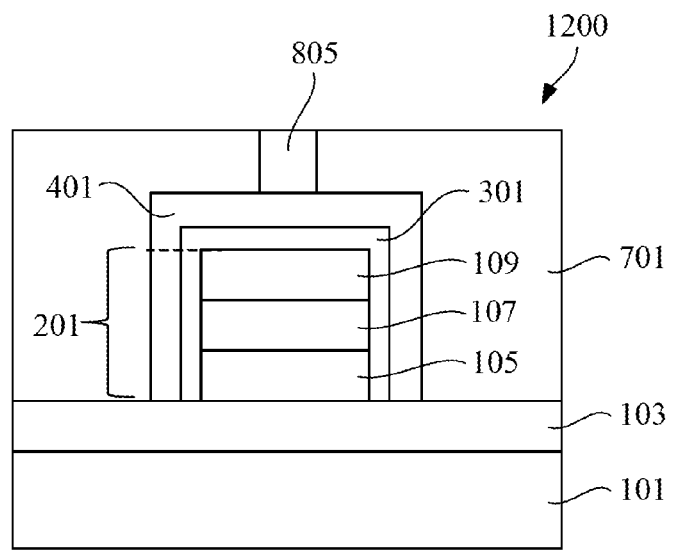

FIGS. 12A, 12B and 12C illustrate various top and cross-sectional views of a semiconductor device 1200 in accordance with some embodiments. In particular, FIG. 12A illustrates a top view, FIG. 12B illustrates a first cross-sectional view along the B-B' line of FIG. 12A, and FIG. 12C illustrates a second cross-sectional view along the C-C' line (perpendicular to the B-B' line) of FIG. 12A. Moreover, various elements of FIGS. 12A-12C are depicted using dashed lines to indicate that such elements are invisible in top and cross-sectional views illustrated in FIGS. 12A-12C. In some embodiments, the semiconductor device 1200 may be formed using similar materials and methods as the semiconductor device 100 described above with reference to FIGS. 1A-8C, with similar elements labeled by similar numerical references, and the description is not repeated herein. As described above with reference to FIGS. 1A-8C, the gate stack 501 of the semiconductor device 100 is formed on two sidewalls and the top surface of the fin-shaped structure 201. In the illustrated embodiment, the gate stack 501 is formed on three sidewalls and the top surface of the fin-shaped structure 201, which may improve gating characteristics of the semiconductor device 1200. In some embodiments, the gates stack 501 extends over and contacts the portion 105a of the first source/drain layer 105.

Figure 13A:
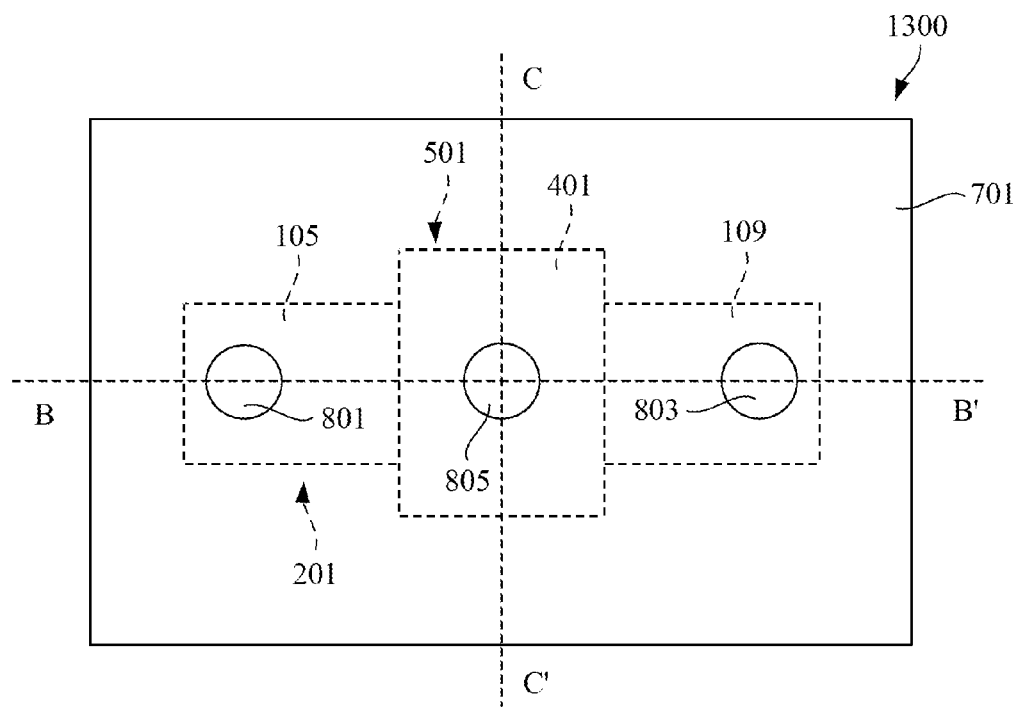
FIGS. 13A, 13B and 13C illustrate various top and cross-sectional views of a semiconductor device in accordance with some embodiments.
Figure 13B:
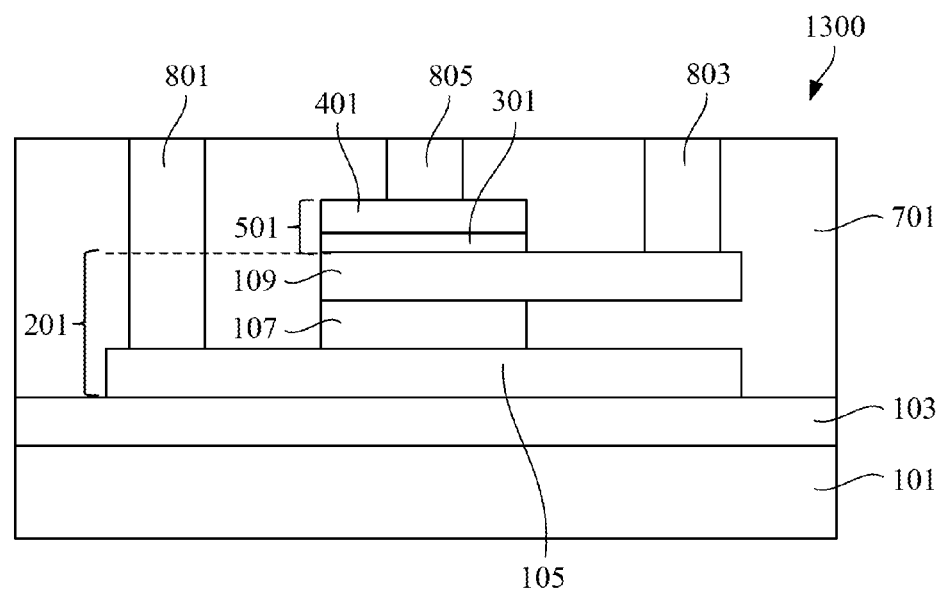
Figure 13C:
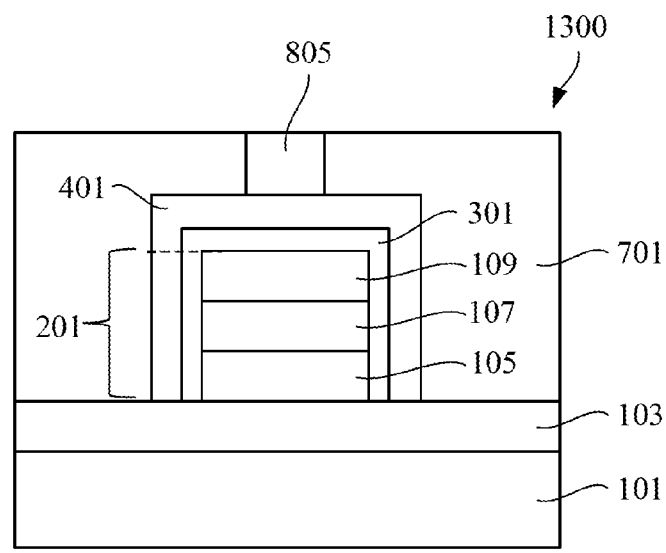

FIGS. 13A, 13B and 13C illustrate various top and cross-sectional views of a semiconductor device 1300 in accordance with some embodiments. In particular, FIG. 13A illustrates a top view, FIG. 13B illustrates a first cross-sectional view along the B-B' line of FIG. 13A, and FIG. 13C illustrates a second cross-sectional view along the C-C' line (perpendicular to the B-B' line) of FIG. 13A. Moreover, various elements of FIGS. 13A-13C are depicted using dashed lines to indicate that such elements are invisible in top and cross-sectional views illustrated in FIGS. 13A-13C. In some embodiments, the semiconductor device 1300 may be formed using similar materials and methods as the semiconductor device 100 described above with reference to FIGS. 1A-8C, with similar elements labeled by similar numerical references, and the description is not repeated herein. In some embodiments, the first source/drain layer 105 and/or the channel layer 107 may be further patterned after performing the patterning process described above with reference to FIGS. 6A-6C. In the illustrated embodiment, the additional patterning process removes the portion 107a of the channel layer 107. In some embodiments, wherein the channel layer 107 is formed of a different material than the first source/drain layer 105 and the second source/drain layer 109, the additional patterning process may include a selective etching process, or the like. In some embodiments, the selective etching process may be performed from the same side as the additional doping process 605 described above with reference to FIGS. 6A-6C. In some embodiments, the additional patterning process effectively removes a leakage path, which may further decrease the off-state leakage current $I_{OFF}$ of the semiconductor device 1300. In other embodiments, the portion 107a of the channel layer 107 may be removed during the patterning process described above with reference to FIGS. 6A-6C.

Figure 14A:
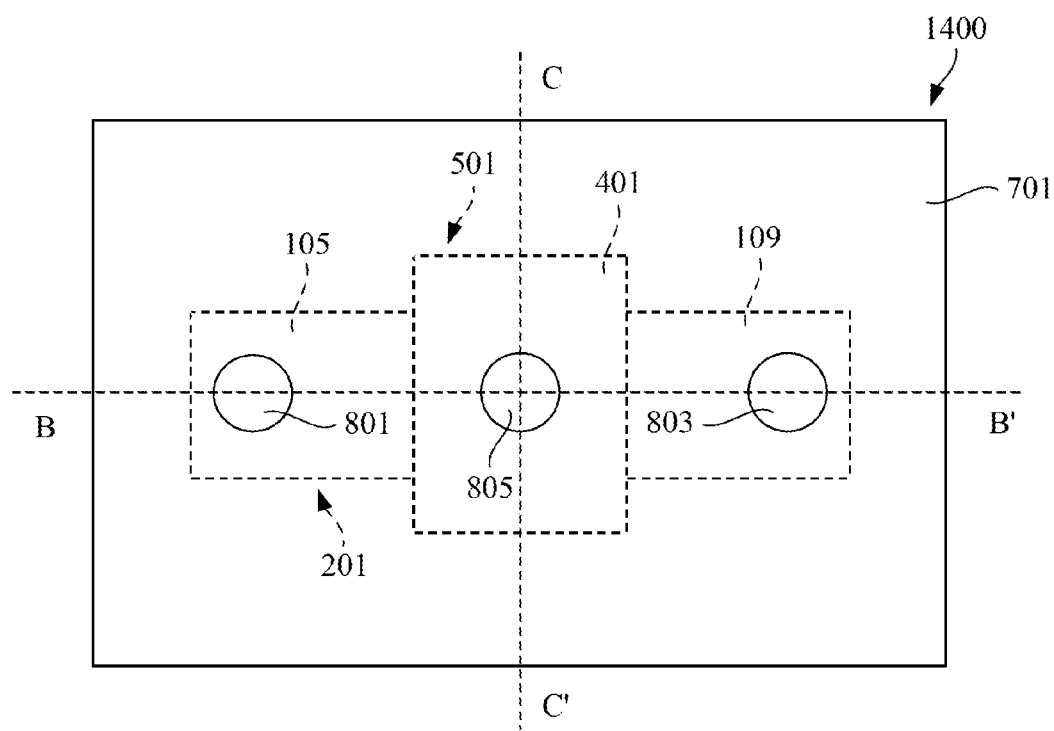
FIGS. 14A, 14B and 14C illustrate various top and cross-sectional views of a semiconductor device in accordance with some embodiments.
Figure 14B:
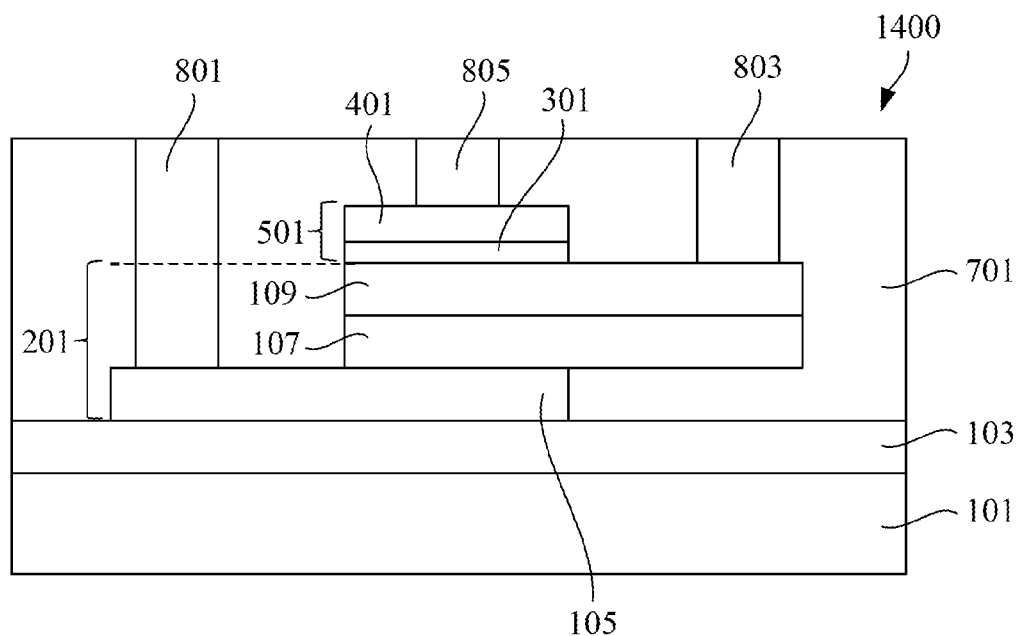
Figure 14C:
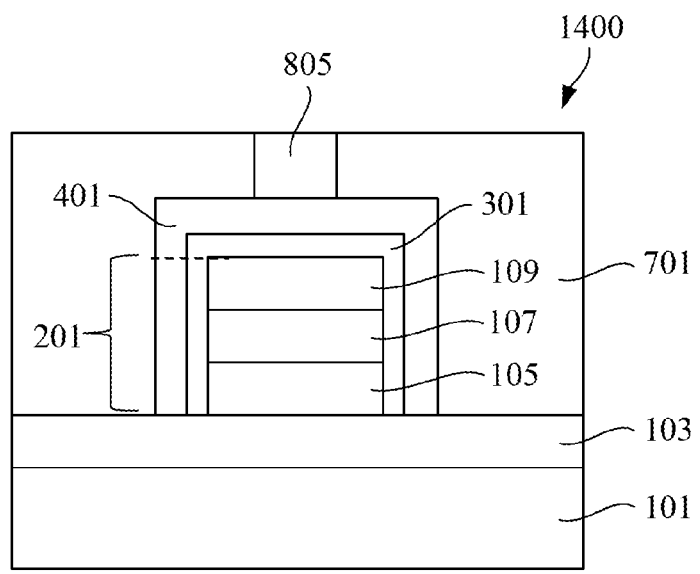

FIGS. 14A, 14B and 14C illustrate various top and cross-sectional views of a semiconductor device 1400 in accordance with some embodiments. In particular, FIG. 14A illustrates a top view, FIG. 14B illustrates a first cross-sectional view along the B-B' line of FIG. 14A, and FIG. 14C illustrates a second cross-sectional view along the C-C' line (perpendicular to the B-B' line) of FIG. 14A. Moreover, various elements of FIGS. 14A-14C are depicted using dashed lines to indicate that such elements are invisible in top and cross-sectional views illustrated in FIGS. 14A-14C. In some embodiments, the semiconductor device 1300 may be formed using similar materials and methods as the semiconductor device 100 described above with reference to FIGS. 1A-8C, with similar elements labeled by similar numerical references, and the description is not repeated herein. In some embodiments, the first source/drain layer 105 and/or the channel layer 107 may be further patterned after performing the patterning process described above with reference to FIGS. 6A-6C. In the illustrated embodiment, the additional patterning process removes the portion 105*b* of the first source/drain layer 105. In some embodiments, wherein the channel layer 107, the first source/drain layer 105 and the second source/drain layer 109 are formed of different materials, the additional patterning process may include a selective etching process, or the like. In some embodiments, the selective etching process may be performed from the same side as the additional doping process 605 described above with reference to FIGS. 6A-6C. In some embodiments, the additional patterning process effectively removes a leakage path, which may further decrease the off-state leakage current $I_{OFF}$ of the semiconductor device 1400. In other embodiments, the portion 105*b* of the first source/drain layer 105 may be removed during the patterning process described above with reference to FIGS. 6A-6C.

Figure 15A:
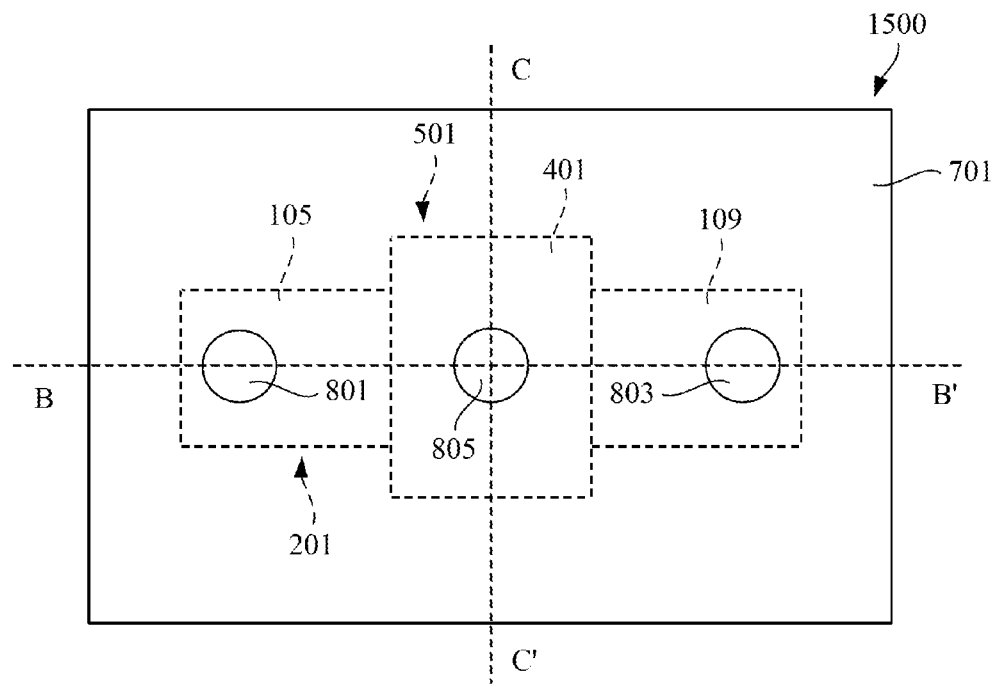
FIGS. 15A, 15B and 15C illustrate various top and cross-sectional views of a semiconductor device in accordance with some embodiments.
Figure 15B:
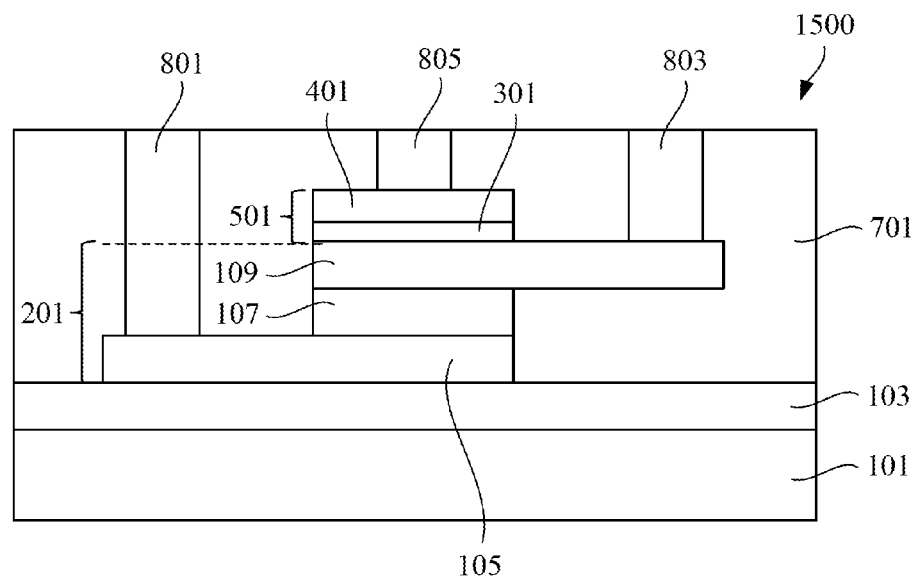
Figure 15C:
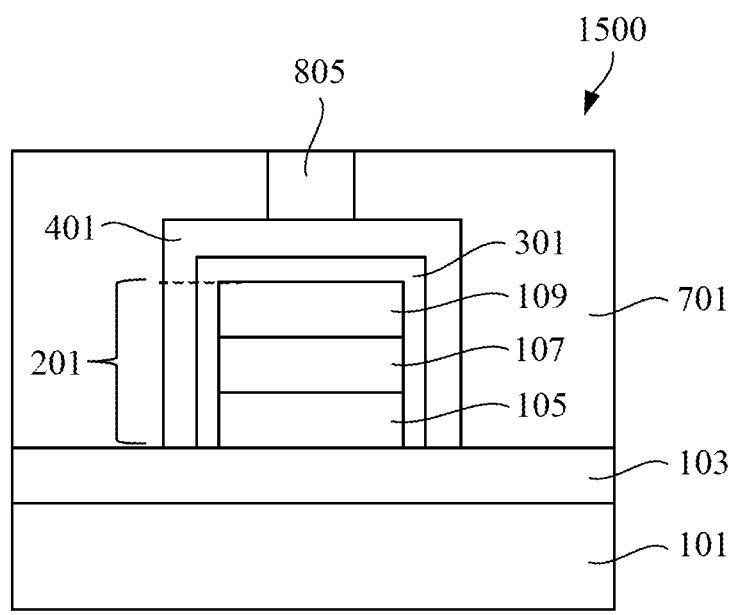

FIGS. 15A, 15B and 15C illustrate various top and cross-sectional views of a semiconductor device 1500 in accordance with some embodiments. In particular, FIG. 15A illustrates a top view, FIG. 15B illustrates a first cross-sectional view along the B-B' line of FIG. 15A, and FIG. 15C illustrates a second cross-sectional view along the C-C' line (perpendicular to the B-B' line) of FIG. 15A. Moreover, various elements of FIGS. 15A-15C are depicted using dashed lines to indicate that such elements are invisible in top and cross-sectional views illustrated in FIGS. 15A-15C. In some embodiments, the semiconductor device 1300 may be formed using similar materials and methods as the semiconductor device 100 described above with reference to FIGS. 1A-8C, with similar elements labeled by similar numerical references, and the description is not repeated herein. In some embodiments, the first source/drain layer 105 and/or the channel layer 107 may be further patterned after performing the patterning process described above with reference to FIGS. 6A-6C. In the illustrated embodiment, the additional patterning process removes the portion 107*a* of the channel layer 107 and the portion 105*b* of the first source/drain layer 105. In some embodiments, wherein the channel layer 107, the first source/drain layer 105 and the second source/drain layer 109 are formed of different materials, the additional patterning process may include one or more selective etching processes, or the like. In some embodiments, the one or more selective etching processes may be performed from the same side as the additional doping process 605 described above with reference to FIGS. 6A-6C. In some embodiments, the additional patterning process effectively removes a leakage path, which may further decrease the off-state leakage current $I_{OFF}$ of the semiconductor device 1500. In other embodiments, the portion 107*a* of the channel layer 107 and the portion 105*b* of the first source/drain layer 105, may be removed during the patterning process described above with reference to FIGS. 6A-6C.

Figure 16:
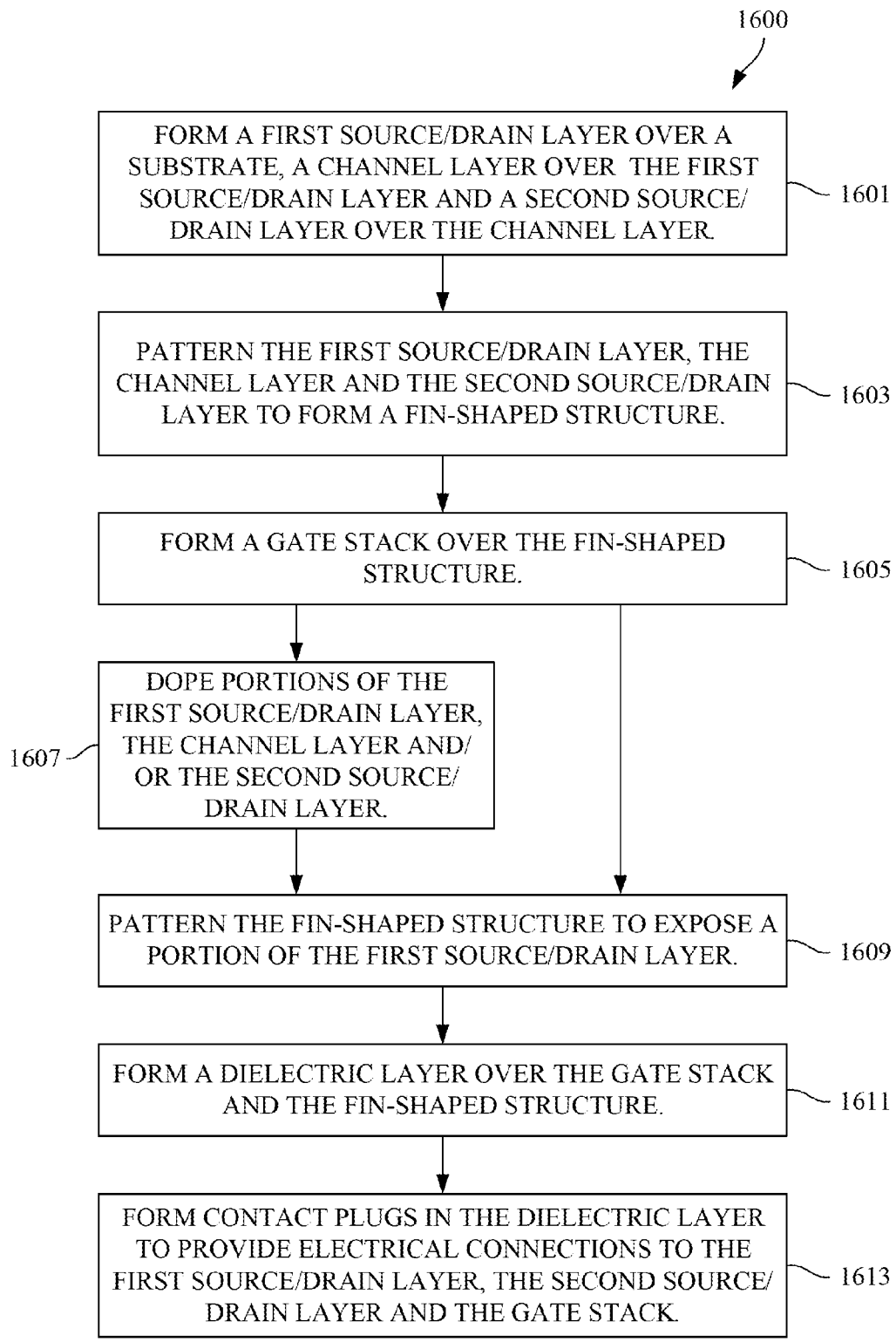
FIG. 16 is a flow diagram illustrating a method of forming a semiconductor device in accordance with some embodiments.

FIG. 16 is a flow diagram illustrating a method 1600 of forming a semiconductor device in accordance with some embodiments. The method starts at step 1601, wherein a first source/drain layer (such as the first source/drain layer 105) is formed over a substrate (such as the substrate 101), a channel layer (such as the channel layer 107) is formed over the first source/drain layer, and a second source/drain layer (such as the second source/drain layer 109) is formed over the channel layer as described above with reference to FIGS. 1A-1C. In some embodiments, step 1601 may further include doping the first source/drain layer, the channel layer and the second source/drain layer as described above with reference to FIGS. 1A-1C. In step 1603, the first source/drain layer, the channel layer and the second source/drain layer are patterned to form a fin-shaped structure (such as the fin-shaped structure 201) over the substrate as described above with reference to FIGS. 2A-2C. In step 1605, a gate stack (such as the gate stack 501) is formed over the fin-shaped structure as described above with reference to FIGS. 3A-5C. In some embodiments, the gate stack is formed on two sidewalls of the fin-shapes structure as described above with reference to FIGS. 8A-8C, 9A-9C, 13A-13C, 14A-14, and 15A-15C. In other embodiments, the gate stack is formed on three sidewalls of the fin-shapes structure as described above with reference to FIGS. 10A-10C, 11A-11C, and 12A-12C. In some embodiments, the method 1600 continues to step 1607 and then to step 1609. In other embodiments, the method 1600 skips step 1607 and continues directly to step 1609. In step 1607, portions of the first source/drain layer, the channel layer and the second source/drain layer are doped as described above with reference to FIGS. 6A-6C. In step 1609, the fin-shaped structure is patterned to expose a portion of the first source/drain layer (such as the portion 105*a* of the first source/drain layer 105) as described above with reference to FIGS. 6A-6C. In some embodiments, the patterning process of step 1609 may further include removing a portion of the first source/drain layer (such as the portion 105*b* of the first source/drain layer 105) and/or a portion of the channel layer (such as the portion 107*a* of the channel layer 107) as describe above with reference to FIGS. 13A-15C. In step 1611, a dielectric layer (such as the second dielectric layer 701) is formed over the gate stack and the fin-shaped structure as described above with reference to FIGS. 7A-7C. In step 1613, contact plugs (such as the first contact plug 801, the second contact plug 803, and the third contact plug 805) are formed in the dielectric layer to provide electrical connections to the first source/drain layer, the second source/drain layer, and the gate stack as described above with reference to FIGS. 7A-8C.

The embodiments of the present disclosure have various advantageous features. In particular, embodiments described above allow for forming vertical FETs with small footprints, the vertical FETs having fin-shaped channel and large source/drain regions to simplify interconnect landing. Moreover, a channel length of a vertical FET is controlled by a thickness of the channel layer and can be scaled below the photolithography limit. In some embodiments, a gate stack is formed on two or more sidewalls of a fin-shaped channel, which allows for improved gating performance. In addition, the gate stack allows for charge modulation in the source/drain regions, may fully deplete charge in the source/drain regions and eliminate a leakage path in the off-state. On the other hand, the gate stack may accumulate charge in the source/drain regions and reduce series resistance between the source/drain regions and the channel in the on-state.

According to an embodiment, a semiconductor device includes a fin-shaped structure over a substrate, the fin-shaped structure comprising a first source/drain layer, a channel layer over the first source/drain layer, and a second source/drain layer over the channel layer, a length of the first source/drain layer being greater than a length of the channel layer. The semiconductor device further includes a gate stack on a first sidewall of the fin-shaped structure.

According to another embodiment, a semiconductor device includes a first source/drain layer over a substrate, a channel layer over the first source/drain layer, and a second source/drain layer over the channel layer, a sidewall of the first source/drain layer being coplanar to a sidewall of the channel layer. The semiconductor device further includes a gate stack on the sidewall of the first source/drain layer and on the sidewall of the channel layer, and a dielectric layer over the second source/drain layer and the gate stack, the dielectric layer contacting a top surface of the first source/drain layer.

According to yet another embodiment, a method of forming a semiconductor device, the method includes forming a first source/drain layer over a substrate. A channel layer is formed over the first source/drain layer. A second source/drain layer is formed over the channel layer. The first source/drain layer, the channel layer, and the second source/drain layer are patterned to form a fin-shaped structure. A gate stack is formed on a sidewall of the fin-shaped structure. The fin-shaped structure is patterned to expose a top surface of the first source/drain layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   forming a first source/drain layer over a substrate;
   forming a channel layer over the first source/drain layer;
   forming a second source/drain layer over the channel layer;
   patterning the first source/drain layer, the channel layer, and the second source/drain layer to form a fin-shaped structure;
   forming a gate stack on a sidewall of the fin-shaped structure; and
   patterning the fin-shaped structure to expose a top surface of the first source/drain layer; and
   after the forming the gate stack, forming a dielectric layer over the first source/drain layer, the second source/drain layer, and the gate stack, the dielectric layer physically contacting the top surface of the first source/drain layer and a top surface of the second source/drain layer.

2. The method of claim 1, further comprising:
   forming a first contact plug, a second contact plug and a third contact plug in the dielectric layer, the first contact plug extending through the dielectric layer and contacting the top surface of the first source/drain layer, the second contact plug extending through the dielectric layer and contacting a top surface of the second source/drain layer, and the third contact plug extending through the dielectric layer and contacting a top surface of the gate stack.

3. The method of claim 1, wherein forming the first source/drain layer and the second source/drain layer comprises doping the first source/drain layer and the second source/drain layer with a first doping process.

4. The method of claim 3, further comprising, after forming the gate stack, doping a portion of the channel layer with a second doping process different from the first doping process.

5. The method of claim 3, further comprising, after forming the gate stack, doping a portion of the first source/drain layer with a second doping process different from the first doping process.

6. The method of claim 1, wherein patterning the fin-shaped structure further exposes a bottom surface of the second source/drain layer.

7. A method comprising:
   forming a fin-shaped structure over a substrate, the fin-shaped structure comprising a first source/drain layer, a channel layer over the first source/drain layer, and a second source/drain layer over the channel layer, a length of the first source/drain layer being greater than a length of the channel layer, the fin-shaped structure doped with a first dopant type;
   forming a gate stack on a first sidewall and a top surface of the fin-shaped structure, the gate stack covering a first portion of the fin-shaped structure, a second portion of the fin-shaped structure adjacent the first portion of the fin-shaped structure; and
   after the forming the gate stack, doping the second portion of the fin-shaped structure with a second dopant type different from the first dopant type.

8. The method of claim 7, further comprising:
   depositing a dielectric layer over the fin-shaped structure and the gate stack, the dielectric layer physically contacting top surfaces of the first source/drain layer and the second source/drain layer; and
   forming contact plugs extending through the dielectric layer and contacting the first source/drain layer, the second source/drain layer, and the gate stack.

9. The method of claim 8, wherein the dielectric layer contacts a top surface of the first source/drain layer.

10. The method of claim 8, wherein a portion of the dielectric layer is interposed between the first source/drain layer and the second source/drain layer.

11. The method of claim 8, wherein the dielectric layer physically contacts a bottom surface of the second source/drain layer.

12. The method of claim 7, wherein forming the gate stack comprises forming the gate stack on a second sidewall of the fin-shaped structure, the second sidewall being opposite of the first sidewall.

13. The method of claim 7, wherein forming the gate stack comprises forming the gate stack on a topmost surface of the fin-shaped structure.

14. A method comprising:
   forming a first source/drain layer over a substrate;
   forming a channel layer over the first source/drain layer;
   forming a second source/drain layer over the channel layer, a sidewall of the first source/drain layer being coplanar to a sidewall of the channel layer;
   forming a gate stack on the sidewall of the first source/drain layer and on the sidewall of the channel layer; and
   after the forming the gate stack, depositing a dielectric layer over the second source/drain layer and the gate stack, the dielectric layer physically contacting a top surface of the first source/drain layer and a top surface of the second source/drain layer.

15. The method of claim 14, wherein depositing the dielectric layer comprises forming the dielectric layer in physical contact with a bottom surface of the channel layer.

16. The method of claim 14, wherein the channel layer is formed with a length smaller than a length of the first source/drain layer.

17. The method of claim 14, further comprising doping the first source/drain layer with a non-uniform doping profile after depositing the dielectric layer.

18. The method of claim 14, further comprising doping the channel layer with a non-uniform doping profile after depositing the dielectric layer.

19. The method of claim 14, wherein the gate stack is further formed over a top surface of the second source/drain layer.

20. The method of claim 14, wherein the gate stack is further formed on a sidewall of the second source/drain layer.

\* \* \* \* \*